United States Patent [19]
Schetzina

[11] Patent Number: 5,818,072
[45] Date of Patent: Oct. 6, 1998

[54] INTEGRATED HETEROSTRUCTURE OF GROUP II-VI SEMICONDUCTOR MATERIALS INCLUDING EPITAXIAL OHMIC CONTACT AND METHOD OF FABRICATING SAME

[75] Inventor: Jan Frederick Schetzina, Cary, N.C.

[73] Assignee: North Carolina State University, Raleigh, N.C.

[21] Appl. No.: 881,599

[22] Filed: May 12, 1992

[51] Int. Cl.$^6$ ............... H01L 29/22; H01L 31/0256; H01L 31/0296; H01L 23/48
[52] U.S. Cl. ............... 257/78; 257/744; 257/461
[58] Field of Search ............... 357/16; 257/78, 257/744, 461

[56] References Cited

U.S. PATENT DOCUMENTS

| | | | |
|---|---|---|---|
| 4,315,796 | 2/1982 | Nishizawa | 156/44 |
| 4,620,058 | 10/1986 | Winterling et al. | 136/258 |
| 4,685,979 | 8/1987 | Nishizawa | 437/81 |
| 4,755,663 | 7/1988 | Derkits, Jr. | 250/211 |
| 4,801,984 | 1/1989 | Woodall | 357/16 |
| 4,887,274 | 12/1989 | Hayakawa et al. | 372/45 |
| 4,893,154 | 1/1990 | Hirai et al. | 357/4 |
| 5,008,891 | 4/1991 | Morita | 372/45 |
| 5,045,897 | 9/1991 | Ahlgren | 357/17 |

FOREIGN PATENT DOCUMENTS 0475606  3/1992  European Pat. Off. .

OTHER PUBLICATIONS

PCT International Search Report dated Aug. 25, 1993 of International Appl. No. PCT/US93/04342 filed Jul. 5, 1993.

*Improved Ohmic Contacts For P–Type ZnSe and Related P–on–N Diode Structures*, Y. Lansari et al., Appl. Phys. Lett. 61 (21), 23 Nov., 1992, pp. 2554–2556.

*HgSe, a Highly Electronegative Stable Metallic Contact for Semiconductor Devices*, Best et al., Applied Physics Letters, vol. 29, No. 7, pp. 433–434, 1976.

*Blue (ZnSe) and Green ($ZnSe_{0.9}Te_{0.1}$) Light Emitting Diodes*, Ren et al. Journal of Crystal Growth, vol. 111, pp. 829–832, 1991.

*Substitutional Doping of ZnSe Films*, Ren. et al., Journal of Crystal Growth, vol. 111, pp. 772–775, 1991.

*ZnSe Light–Emitting Diodes*, Ren et al., Applied Physics Letters, vol. 57, No. 18, pp. 1901–1903, 1900.

*Blue/Green pn Junction Electroluminescence From ZnSe-–based Multiple Quantum–Well Structures*, Xie et al., Applied Physics Letters, vol. 60, No. 4, pp. 463–465, 1992.

*Noncontact Electrical Characterization of Low–Resistivity p–Type ZnSe:N Grown by Molecular Beam Epitaxy*, Park et al., Applied Physical Letters, vol. 59, No. 16, pp. 1896–1898, 1991.

(List continued on next page.)

Primary Examiner—Stephen Meier
Attorney, Agent, or Firm—Myers Bigel Sibley & Sajovec

[57] ABSTRACT

An ohmic contact to a p-type zinc selenide (ZnSe) layer in a Group II–VI semiconductor device, includes a zinc mercury selenide ($Zn_xHg_{1-x}Se$) layer on the zinc selenide layer, a mercury selenide (HgSe) layer on the zinc mercury selenide layer and a conductor (such as metal) layer on the mercury selenide layer. The zinc mercury selenide and mercury selenide layers between the p-type zinc selenide and the conductor layer provide an ohmic contact by eliminating the band offset between the wide bandgap zinc selenide and the conductor. Step graded, linear graded, and parabolic graded layers of zinc mercury selenide may be provided. A layer of mercury selenide without the mercury zinc selenide layer may also provide an ohmic contact. The ohmic contact of the present invention produces nearly ideal voltage-current relation, so that high efficiency Group II–VI optoelectronic devices may be obtained. The integrated heterostructure is formed by epitaxially depositing the ohmic contact on the Group II–VI device. A removable overcoat layer may be formed on the Group II–VI device to allow room temperature atmospheric pressure transfer of the device from a zinc based deposition chamber to a mercury based deposition chamber, for deposition of the ohmic contact.

34 Claims, 23 Drawing Sheets

OTHER PUBLICATIONS

*Blue–Green Laser Diodes,* Haase et al., Applied Physics Letters, vol. 59, No. 11, pp. 1272–1274, 1991.

*Blue–Green Injection Laser Diodes in (Zn,Cd)Se/ZnSe Quantum Wells,* Jeon et al., Applied Physics Letters, vol. 59, No. 27, pp. 3619–3621, 1991.

*Lattice–Matched Heterostructures as Schottky Barriers: HgSe/CdSe,* Best et al., Journal of Vacuum Science and Technology, vol. 16, No. 5, pp. 1130–1133, 1979.

*Elimination of Heterojunction Band Discontinuities by Modulation Doping,* Schubert et al., Applied Physics Letters, vol. 60, No. 4, pp. 466–468, 1992.

*ZnSe Based Multilayer pn Junctions as Efficient Light Emitting Diodes for Display Applications,* Jeon et al., Applied Physics Letters, vol. 60, No. 7, pp. 892–894, 1992.

*Blue and Green Diode Lasers in ZnSe–based Quantum Wells,* Jeon et al., Appied Physics Letters, vol. 60, No. 17, pp. 2045–2047, 1992.

*Room Temperature Blue Light Emitting p–n Diodes from Zn(S,Se)–based Multiple Quantum Well Structures,* Xie et al., Applied Physics Letters, vol. 60, No. 16, pp. 1999–2001, 1992.

*Highly Electronegative Contacts to Compound Semiconductors,* Scranton et al., Journal of Vacuum Science Technology, vol. 14, No. 4, pp. 930–934, 1977.

INTEGRATED HETEROSTRUCTURE OF GROUP II-VI SEMICONDUCTOR MATERIALS INCLUDING EPITAXIAL OHMIC CONTACT AND METHOD OF FABRICATING SAME

U.S. GOVERNMENT RIGHTS

This invention was made with government support under Grant No. DMR-88-13525 awarded by the National Science Foundation. The U.S. Government has certain rights in the invention.

FIELD OF THE INVENTION

This invention relates to semiconductor devices, and more particularly to semiconductor devices formed of Group II–VI compound semiconductor materials.

BACKGROUND OF THE INVENTION

Microelectronic applications of Group II–VI semiconductor materials have been widely investigated. In particular, the wide bandgap Group II–VI semiconductor zinc selenide (ZnSe), and its related alloys such as zinc cadmium selenide (ZnCdSe) and zinc sulfur selenide (ZnSSe), are being widely investigated as optoelectronic devices which are effective from the blue to the green region of the visible spectrum. As is well known to those having skill in the art, the wide bandgap of these Group II–VI devices compared to their equivalent nearly lattice matched Group III–V or elemental semiconductor materials, make these wide bandgap Group II–VI semiconductors potential candidates for blue to green optoelectronic devices. Blue to green optoelectronic sources are currently sought for a number of applications, including full color electroluminescent displays, read-write laser sources for high density information storage on magnetic and optical media, sources for undersea optical communications and other applications.

Molecular beam epitaxy and other fabrication techniques have recently been developed so that both n-type and p-type doped layers of zinc selenide and other related II–VI semiconductor materials may be grown. See for example a publication by Ren et al. entitled *Substitutional Doping of ZnSe Films*, Journal of Crystal Growth, Vol. 111, pp. 772–775, 1991. It has also long been known to make Schottky contacts to n-type zinc selenide using mercury selenide (HgSe). See the publications entitled *HgSe, a Highly Electronegative Stable Metallic Contact for Semiconductor Devices* by Best et al., Applied Physics Letters, Vol. 29, No. 7, pp. 433–434, 1976; *Highly Electronegative Contacts to Compound Semiconductors* by Scranton et al., Journal of Vacuum Science and Technology, Vol. 14, No. 4, pp. 930–934, 1977; and *Lattice-Matched Heterostructures as Schottky Barriers: HgSe/CdSe* by Best et al., Journal of Vacuum Science Technology, Vol. 16, No. 5, pp. 1130–1133, 1979.

As a result of these and other developments, at least four research groups have recently described the fabrication of blue and/or green light emitting diodes and/or laser diodes from Group II–VI semiconductors.

The first group is from North Carolina State University (NCSU) and includes the present inventor. The fabrication of blue and green light emitting diodes based on ZnSe and alloys thereof is described in a publication entitled *ZnSe Light-Emitting Diodes* by Ren et al., Applied Physics Letters, Vol. 57, No. 18, pp. 1901–1903, October, 1990, and *Blue (ZnSe) and Green ($ZnSe_{0.9}Te_{0.1}$) Light Emitting Diodes* by Ren et al., Journal of Crystal Growth, Vol. 111, pp. 829–832, 1991.

A second group of researchers from Brown University and Purdue University have also described zinc selenide based laser diodes and light emitting diodes in publications entitled *Blue-Green Injection Laser Diodes in (Zn,Cd)Se/ZnSe Quantum Wells* by Jeon et al., Applied Physics Letters Vol. 59, No. 27, pp. 3619–3621, December, 1991; *Blue/Green pn Junction Electroluminescence from ZnSe-based Multiple Quantum-Well Structures* by Xie et al., Applied Physics Letters Vol. 60, No. 4, pp. 463–465, January, 1992; *ZnSe Based Multilayer pn Junctions as Efficient Light Emitting Diodes for Display Applications*, Jeon et al., Applied Physics Letters, Vol. 60, No. 7, pp. 892–894, February, 1992; *Blue and Green Diode Lasers in ZnSe-Based Quantum Wells*, Jeon et al., Applied Physics Letters, Vol. 60, No. 17, April, 1992; and *Room Temperature Blue Light Emitting P-N Diodes from Zn(S,Se)-Based Multiple Quantum Well Structures*, Xie et al., Applied Physics Letters, Vol. 60, No. 16, April, 1992, pp. 1999–2001.

A third group from 3M company described a zinc selenide based laser diode in an article entitled *Blue-Green Laser Diodes* by Haase et al., Applied Physics Letters, Vol. 59, No. 11, pp. 1272–1274, September, 1991. A fourth group from the University of Florida and Bellcore described fabrication of LEDs and light emitting diodes using zinc selenide in an article entitled *Noncontact Electrical Characterization of Low-Resistivity p-type ZnSe:N Grown by Molecular Beam Epitaxy* by Park et al., Applied Physics Letters, Vol. 59, No. 15, pp. 1896–1898, 1991.

The above publications indicate that the art has now successfully fabricated blue and green optoelectrical devices from ZnSe-based materials. As Group II–VI fabrication processes are further refined, optical characteristics such as frequency spectrum width and operational lifetime are expected to improve due to reduced dislocation densities in the materials and other improvements.

A major problem with all of these devices, however, has been the ohmic (nonrectifying) contact to zinc selenide, and in particular to p-type zinc selenide. This is a fundamental problem, which is related to the very deep energy of the valence band of zinc selenide. As a consequence, contacts to p-type zinc selenide and related alloys, using conventional metals such as silver or gold, are not ohmic. In effect, the contacts which have been considered by researchers as being ohmic, actually constitute a reverse biased Schottky diode in series with the device, resulting in a large voltage drop across the supposedly ohmic contact. This large voltage drop results in almost all of the input power to the device being lost as heat. High voltages, of 20–50V or more, have been required in order to induce optical emission, and the resultant heat destroys the devices.

The "ohmic contact problem" for zinc selenide optical emitter devices has been widely reported. See for example the above cited 1990 Ren et al. article from the NCSU group, at page 1901: "It was not possible for us to complete Hall effect studies on the ZnSe:Li samples because of problems associated with non-ohmic contacts." See also the above cited 1992 article by Xie et al. from the Brown-Purdue group, at page 463: "Hall measurements on the p-type layers were unreliable due to the difficulty in forming ohmic contacts to the widegap semiconductor." See also the Haase et al. article by the 3M group at page 1273: "Heating in these samples is a serious problem as the contact between the Au and the p-ZnSe presents a large barrier." Finally, see the Park et al. article from the University of Florida/Bellcore group which notes that " . . . serious problems currently exist with regard to providing low-resistance ohmic contact to p-type ZnSe material . . . "

The above survey indicates that although significant advances have been made in fabricating Group II–VI devices, and in particular zinc selenide based optoelectronic devices, the ohmic contact to these devices, and in particular to p-type zinc selenide, remains a fundamental concern that has heretofore eluded multiple independent groups of researchers.

SUMMARY OF THE INVENTION

It is therefore an object of the present invention to provide an improved Group II–VI semiconductor device including an ohmic contact therefor.

It is another object of the invention to provide an improved Group II–VI optoelectronic device including an ohmic contact therefor.

It is still another object of the invention to provide an ohmic contact for p-type zinc selenide and alloys thereof.

These and other objects are provided, according to the present invention by an ohmic contact for a semiconductor device formed of Group II–VI semiconductor materials, wherein the contact includes a lattice matched monocrystalline ternary compound Group II–VI semiconductor material on the Group II–VI semiconductor device, a lattice matched monocrystalline Group II–VI semimetal on the Group II–VI semiconductor material and a conductor, such as a metal, on the Group II–VI semimetal. The ternary compound Group II–VI semiconductor material and the semimetal, between the Group II–VI semiconductor material and the conductor layer, eliminate the band offset between the wide bandgap Group II–VI semiconductor material and the conductor layer, to thereby provide an ohmic contact for the Group II–VI semiconductor material.

In particular, according to the invention, an ohmic contact for zinc selenide (ZnSe) or an alloy thereof, and particularly for p-type zinc selenide or an alloy thereof, is provided by a heterostructure including a zinc mercury selenide($Zn_xHg_{1-x}Se$) layer on the layer of zinc selenide or alloy thereof, and a mercury selenide(HgSe) layer on the zinc mercury selenide layer. A conductor (such as metal) layer is formed on the mercury selenide layer. The zinc mercury selenide and mercury selenide layers between the p-type zinc selenide and the conductor layer provide an ohmic contact by eliminating the band offset between the wide bandgap zinc selenide and the conductor.

Many alternative formulations of the zinc mercury selenide layer of the present invention may be provided. In particular, the ratio of zinc to mercury may be constant across the layer to provide a step graded zinc mercury selenide layer. Alternatively, the amount of mercury may increase from the zinc selenide layer to the mercury selenide layer. One form of increase is a linear increase, to provide a linear graded zinc mercury selenide layer. Alternatively, and preferably, the amount of mercury increases nonlinearly from the zinc selenide layer to the mercury selenide layer to provide a nonlinear graded zinc mercury selenide layer. Preferably, a parabolic graded layer is provided, in which the amount of mercury increases parabolically.

According to the invention, at least some of the zinc mercury selenide layer adjacent the p-type zinc selenide layer is doped p-type. Preferably, half the thickness of the zinc mercury selenide layer, adjacent the zinc selenide layer, is doped p-type, and the other half of the zinc mercury selenide layer, adjacent the mercury selenide layer, is of neutral conductivity. Modulation doping may also be used in the parabolically graded zinc mercury selenide layer.

It has also been found, according to the present invention, that a p-type layer of mercury selenide between the p-type zinc selenide layer and the conductor layer, can provide an ohmic contact for p-type zinc selenide which is far superior to conventional gold or silver ohmic contacts. The ohmic contacts of the present invention produce a nearly ideal (linear) voltage-current relation, indicating that the contacts are indeed ohmic. Hall effect measurements may also be taken, which verify that the contacts are ohmic. When a Group II–VI optoelectronic device is integrated with the ohmic contacts of the present invention, an integrated heterostructure device is formed, with one heterostructure providing an optical function such as e.g. light emission, and another heterostructure providing an electrical function such as ohmic contact. These integrated heterostructures can emit radiation in the blue to green frequency range with an input voltage of five volts or less, resulting in high efficiency Group II–VI optoelectronic devices.

An integrated heterostructure according to the present invention may be formed by epitaxially forming an optical heterostructure and an electrical heterostructure as described above. Typically, the optical heterostructure (such as a laser diode or light emitting diode) is formed in a first chamber, using molecular beam epitaxy (MBE) of zinc selenide and related alloys. The electrical heterostructure (ohmic contact) is typically fabricated in a second deposition chamber because of the special requirements for depositing mercury based materials. Transfer between the first and second chambers typically must take place under ultra high vacuum conditions. Alternatively, according to the present invention, a mercury based electrical heterostructure may be formed on a zinc selenide based optical heterostructure without the need for ultra high vacuum transfer between MBE chambers, by forming a thin overcoat layer, for example, selenium, on the optical heterostructure. This structure can then be removed from the zinc selenide MBE chamber and inserted into a mercury based MBE chamber at room temperature and under atmospheric conditions. Once the structure is placed in the mercury based chamber, and the chamber is evacuated, the selenium overcoat layer may be evaporated and the mercury based electrical heterostructure may be epitaxially formed on the zinc selenide based optical heterostructure.

DESCRIPTION OF A PREFERRED EMBODIMENT

The present invention now will be described more fully hereinafter with reference to the accompanying drawings, in which a preferred embodiment of the invention is shown. This invention may, however, be embodied in many different forms and should not be construed as limited to the embodiment set forth herein; rather, this embodiment is provided so that this disclosure will be thorough and complete, and will fully convey the scope of the invention to those skilled in the art. Like numbers refer to like elements throughout.

Figure 1:
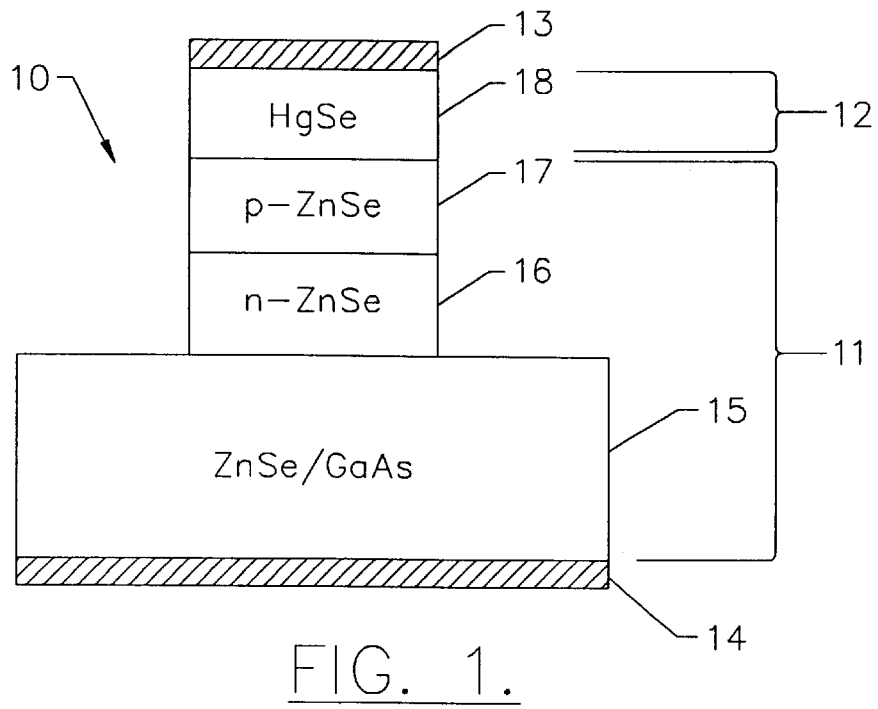
FIG. 1 is a cross-sectional illustration of a first embodiment of an optical emitter having an ohmic contact according to the present invention.

Referring now to FIG. 1, a first embodiment of an optical emitter having an ohmic contact according to the present invention is illustrated. Optical emitter 10 is an integrated heterostructure including an optical heterostructure 11 and an electrical heterostructure 12. Optical heterostructure 11 can be a well known blue to green light emitting diode or laser diode structure, or any other Group II–VI device now known or discovered later. As shown in FIG. 1, the optical heterostructure 11 is a blue light emitting diode (LED). The blue LED is formed on a substrate 15 of zinc selenide, gallium arsenide or any other known material. The LED is a p-n junction between n-type zinc selenide layer 16 and p-type zinc selenide layer 17. Both zinc selenide layers may be formed on substrate 15 using well known techniques such as molecular beam epitaxy, and both layers may be doped at $10^{18}$ carrier per cubic centimeter. Bottom contact 14 is formed of metal such as gold-germanium for n-type GaAs or indium for n-type ZnSe, or other well known conductors. It will be understood by those having skill in the art, that, as used herein, when a layer is formed "on" another layer, it may be formed directly on the underlying layer, or one or more intervening layers may be present.

Figure 2:
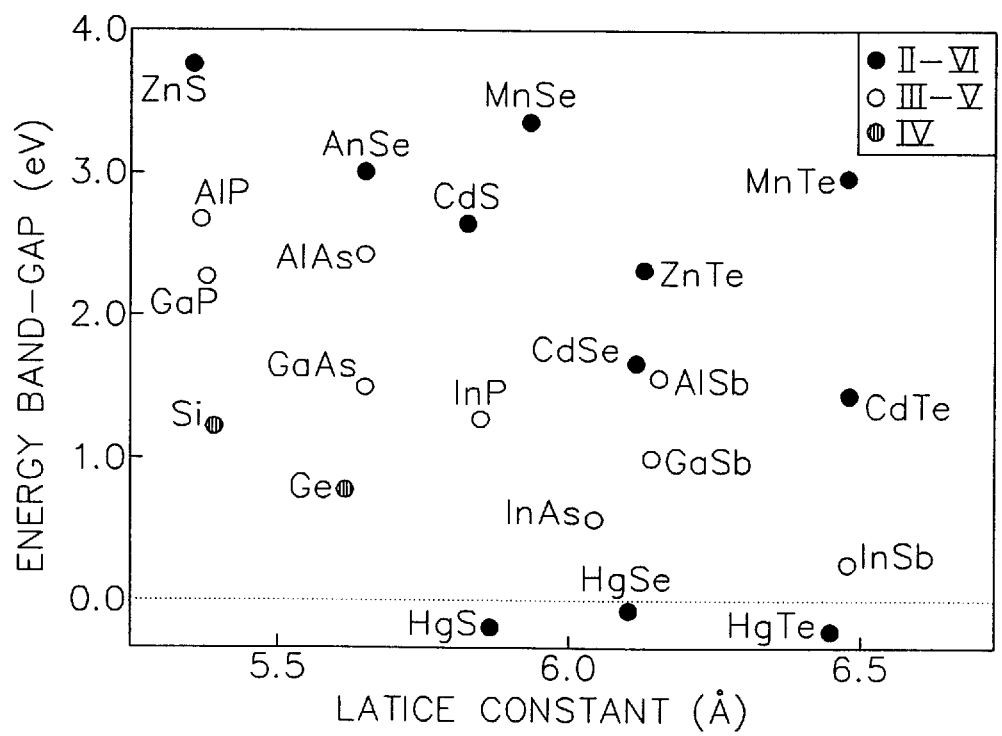
FIG. 2 graphically illustrates energy bandgap versus lattice constant for selected semiconductor materials.

Still referring to FIG. 1, the electrical portion 12 of the integrated heterostructure 10 comprises a layer of mercury selenide. As is well known to those having skill in the art, mercury selenide is a semimetal rather than a semiconductor, because it has a bandgap that is zero. It will be understood by those having skill in the art that the integrated optical structure 11 and electrical structure 12 is epitaxially formed as a monolithic structure, with lattice match between adjacent layers so as to produce minimal dislocations at the junctions between the layers. FIG. 2 illustrates the energy bandgap versus lattice constant for various Group IV single element semiconductors, Group III–VI compound semiconductors and Group II–VI compound semiconductors and semimetals.

Figure 3:
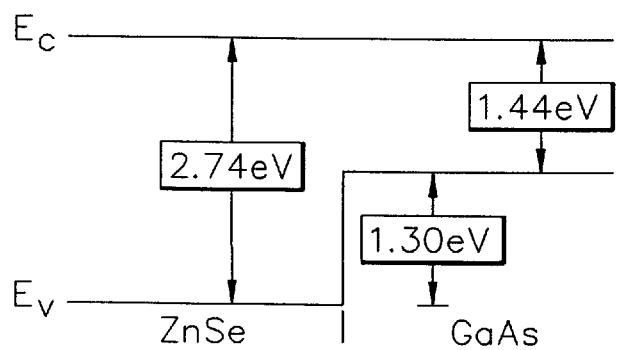
FIG. 3 is an energy band diagram illustrating the band offsets between zinc selenide and gallium arsenide.
Figure 4:
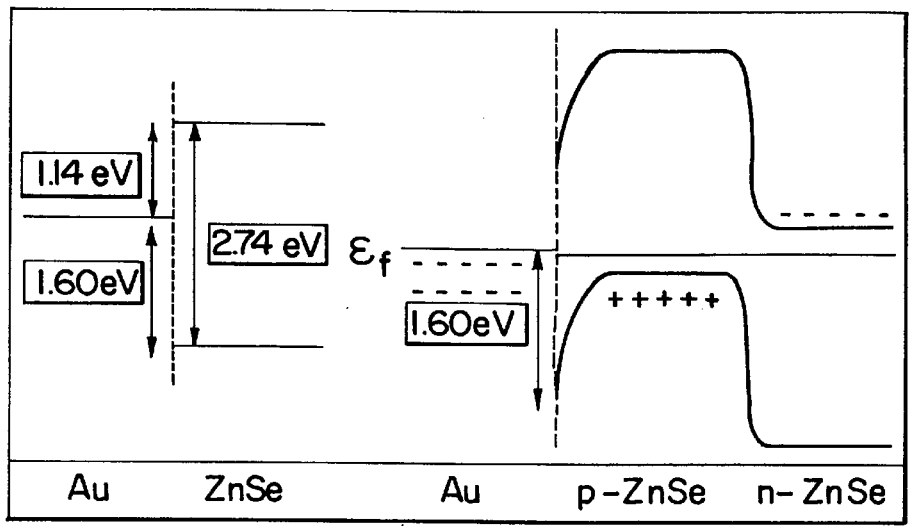
FIG. 4 is an energy band diagram showing the energy band lineup between gold and zinc selenide.
Figure 5:
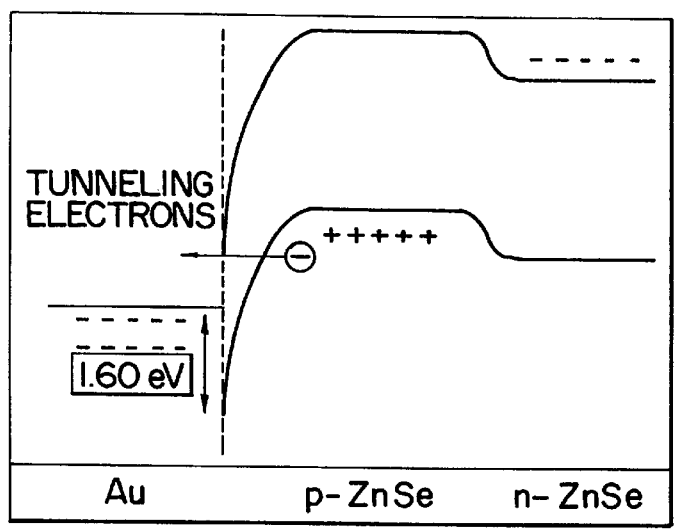
FIG. 5 is an energy band diagram illustrating the band lineups of a zinc selenide p-on-n diode under forward bias.

It has been found, according to the invention, that mercury selenide forms a good ohmic contact to p-type zinc selenide and thereby solves the last fundamental problem in development of high efficiency Group II–VI devices. FIG. 3 illustrates the origin of the ohmic contact problem. As shown in FIG. 3, there is essentially no conduction band ($E_c$) offset between zinc selenide and gallium arsenide. As a consequence, valence band ($E_v$) offset is very large: about 1.3 electron volts (eV). The deep valence band of zinc selenide is the source of the ohmic contact problem. Gold, which has the largest work function of all metals, has proven to be an ineffective ohmic contact to zinc selenide. Gold forms a barrier of about 1.1 electron volts on n-type zinc selenide. A gold/zinc selenide interface, as shown in FIG. 4, produces a band offset of about 1.6 electron volts. Accordingly, the use of gold as an ohmic contact to a p-on-n zinc selenide homojunction, produces the band bending shown in FIG. 5.

Figure 6:
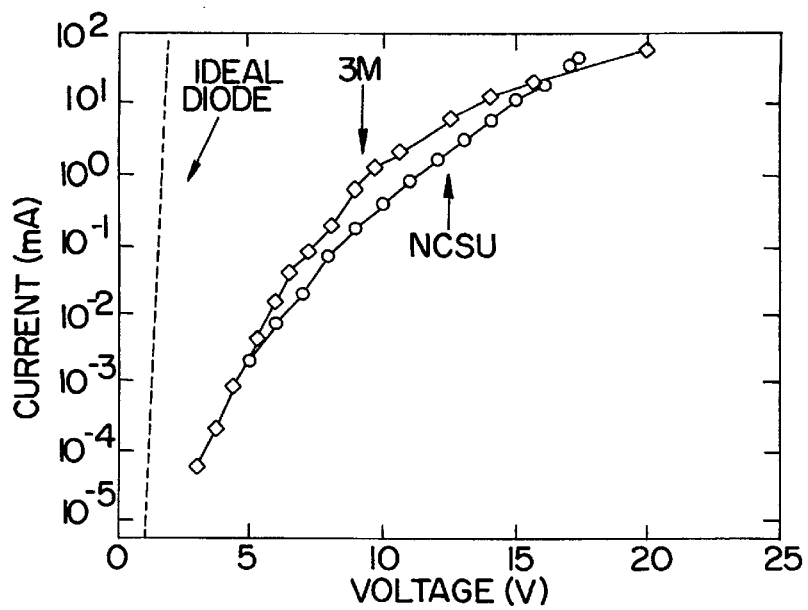
FIG. 6 graphically illustrates the current-voltage characteristics of various zinc selenide based heterostructures.

Under forward bias of the zinc selenide diode, the gold/p-type zinc selenide junction is reverse biased and current flow is limited by carrier tunneling through the heterobarrier. This is illustrated by the current-voltage characteristics shown in FIG. 6 as reported by the 3M Group for their initial laser diode. Data for LED's prepared by the NCSU group is also shown to illustrate that the forward characteristics are similar for samples prepared in different laboratories. This data strongly suggests that the current limiting device is a series diode undergoing reverse breakdown. This diode is associated with reverse breakdown via carrier tunneling of the gold-zinc selenide Schottky diode heterointerface.

Figure 7:
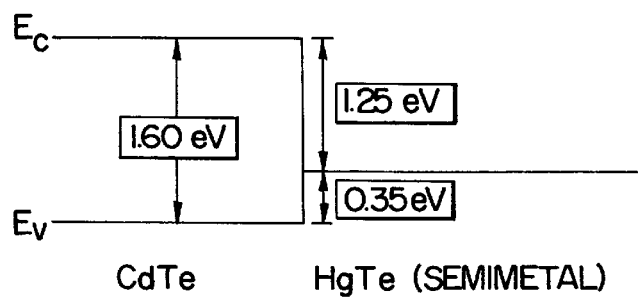
FIG. 7 is an energy band diagram showing the band lineup between cadmium telluride and mercury telluride.

In order to develop high efficiency LEDs and lasers from zinc selenide and related materials, the ohmic contact problem must be solved. A solution to the ohmic contact problem has been found by studying the valence band offset between mercury telluride (HgTe) and cadmium telluride (CdTe). As shown in FIG. 7, it has been found that the valence band offset is 0.35 electron volts. Earlier estimates, based on the "common anion rule" implied a band offset of zero. Accordingly, the common anion rule must be rephrased as a "modified common anion rule" for Group II–VI materials containing mercury which is consistent with the mercury telluride/cadmium telluride valence band offset results. As shown in FIG. 7, a modified common anion rule gives:

$$\Delta E_c/\Delta E_v = 1.25/0.350 = 3.6 \tag{1}$$

Figure 8:
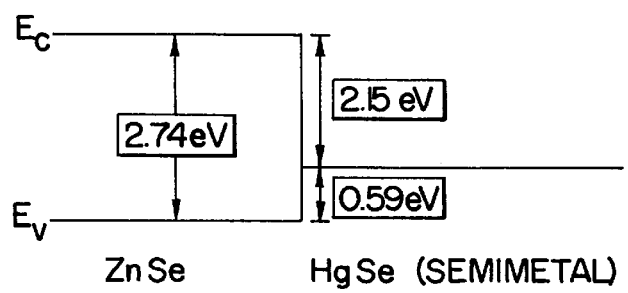
FIG. 8 is an energy band diagram showing the band lineups between zinc selenide and mercury selenide.

If Equation (1) holds for the mercury selenide/zinc selenide interface, then $$\Delta E_c + \Delta E_v = Eq_{(ZnSe)} = 2.70 \text{ eV} \tag{2}$$

and a valence band offset $\Delta E_v$ of 0.59 electron volts is obtained for the mercury selenide/zinc selenide interface as shown in FIG. 8. This represents nearly a threefold decrease compared to a gold/zinc selenide interface barrier of about 1.6 electron volts. Thus, a layer of epitaxial mercury selenide on p-type zinc selenide should provide a much better ohmic contact than gold.

Figure 9:
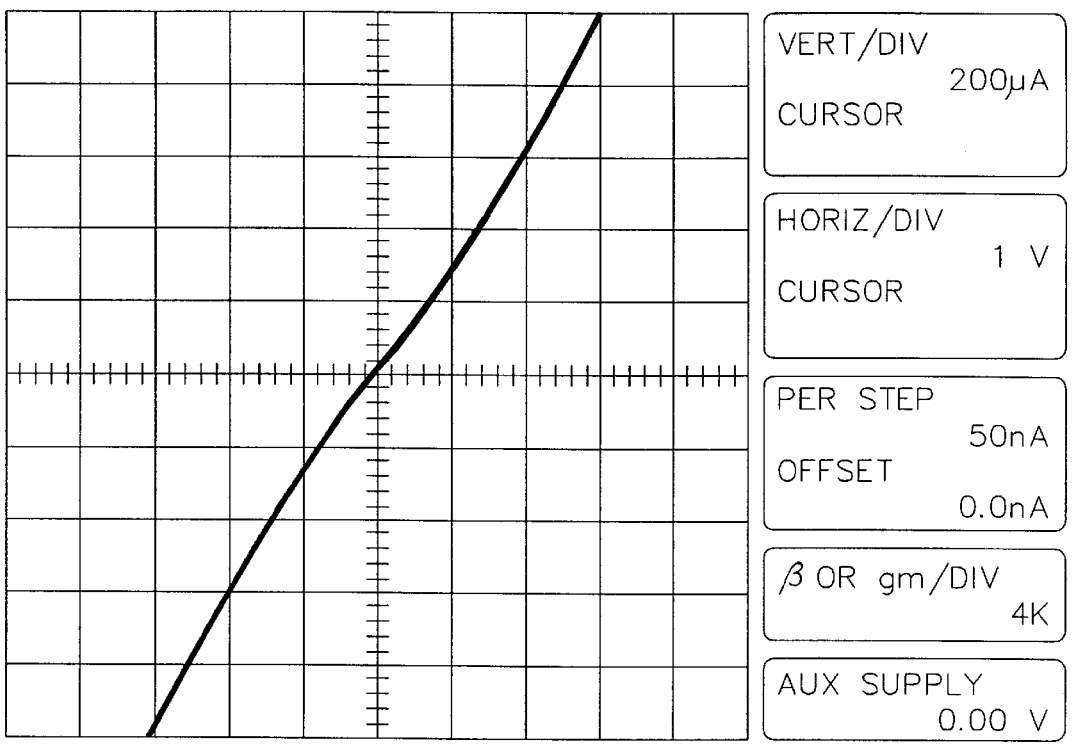
FIG. 9 is a graphical illustration of the voltage current relationship for an ohmic contact according to the present invention.

FIG. 9 graphically illustrates the voltage-current relationship for an ohmic contact according to the present invention. In order to fabricate this ohmic contact, a layer of mercury selenide was grown, by molecular beam epitaxy, onto p-type (nitrogen doped) zinc selenide samples. Standard photolithographic processing was then used to define four contacts on each of the samples for Hall effect measurements. FIG. 9 shows the current-voltage relationship between adjacent Hall contacts one centimeter apart of a representative sample. Apart from a small (about 0.1 volt) offset, the contacts are very nearly ohmic, thus indicating that electrical contacts, good enough for Hall effect measurement, are now available.

Several diode structures were prepared using molecular beam epitaxy deposition. The p-type layers included zinc sulfur selenide doped with nitrogen followed by a layer of nitrogen doped p-type zinc selenide and a layer of mercury selenide. Diodes were then prepared for testing using standard techniques.

Figure 10A:
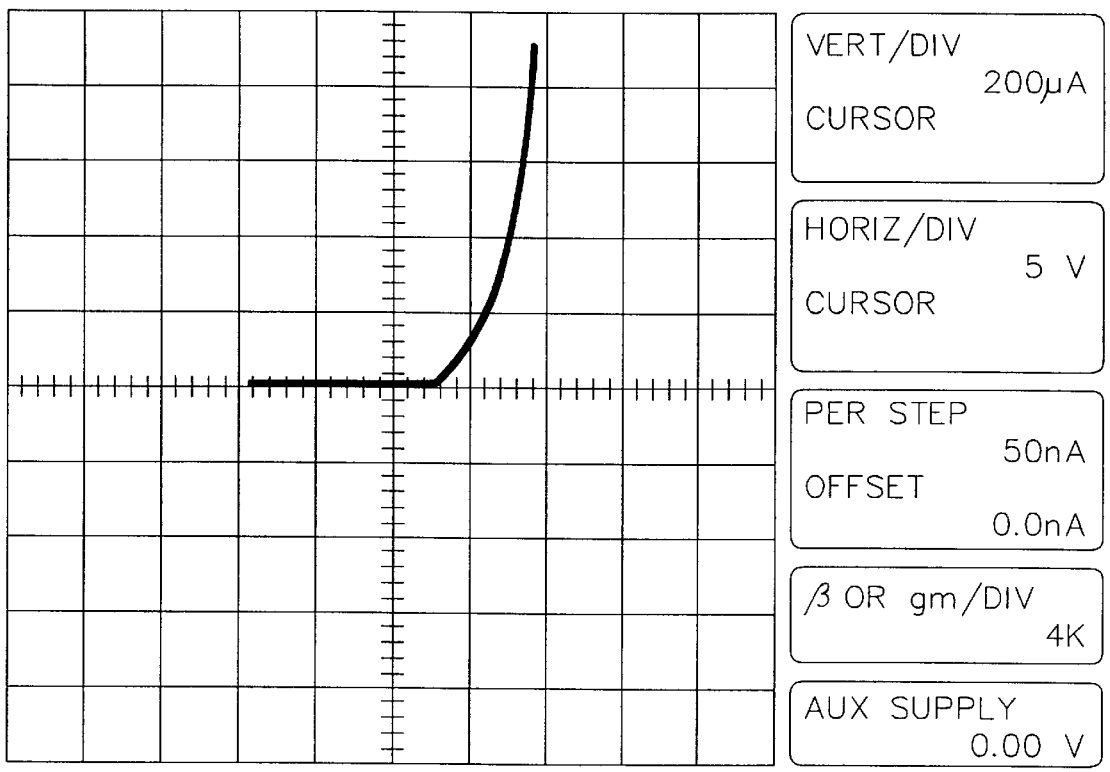
FIG. 10a illustrates the current-voltage relationship for a known zinc selenide light emitting diode.
Figure 10B:
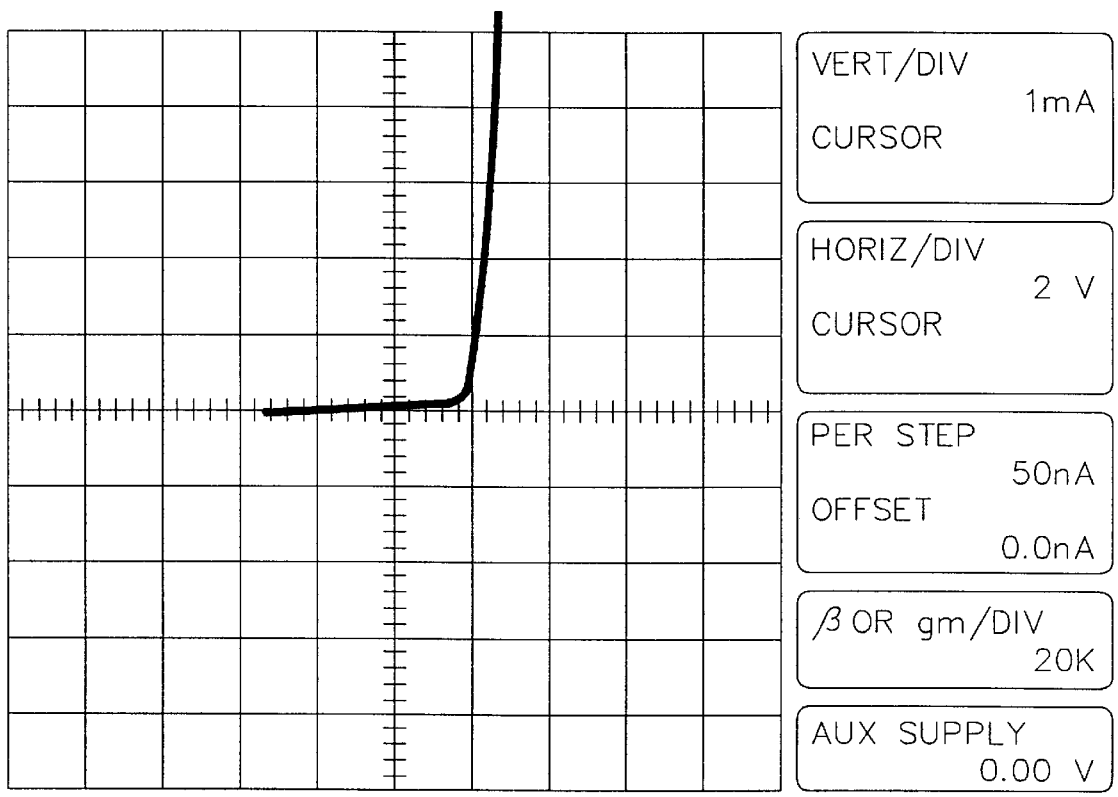
FIGS. 10b–10d illustrate the current-voltage relationships for light emitting diodes including an ohmic contact according to the present invention.
Figure 10C:
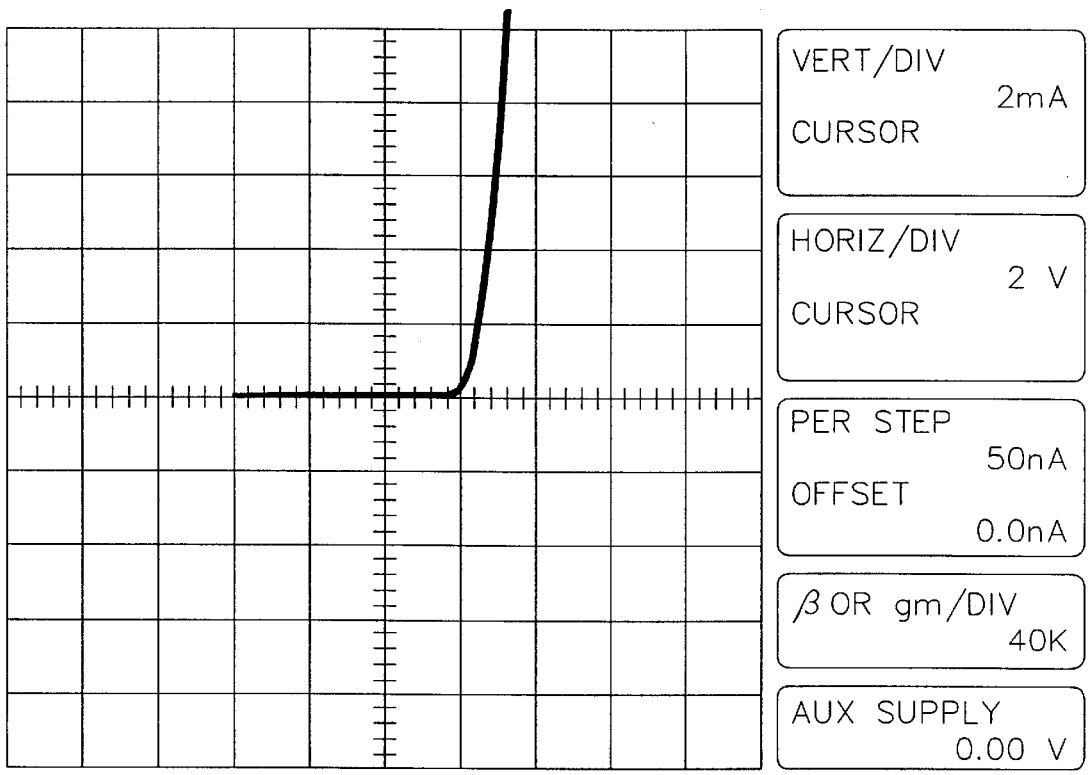
Figure 10D:
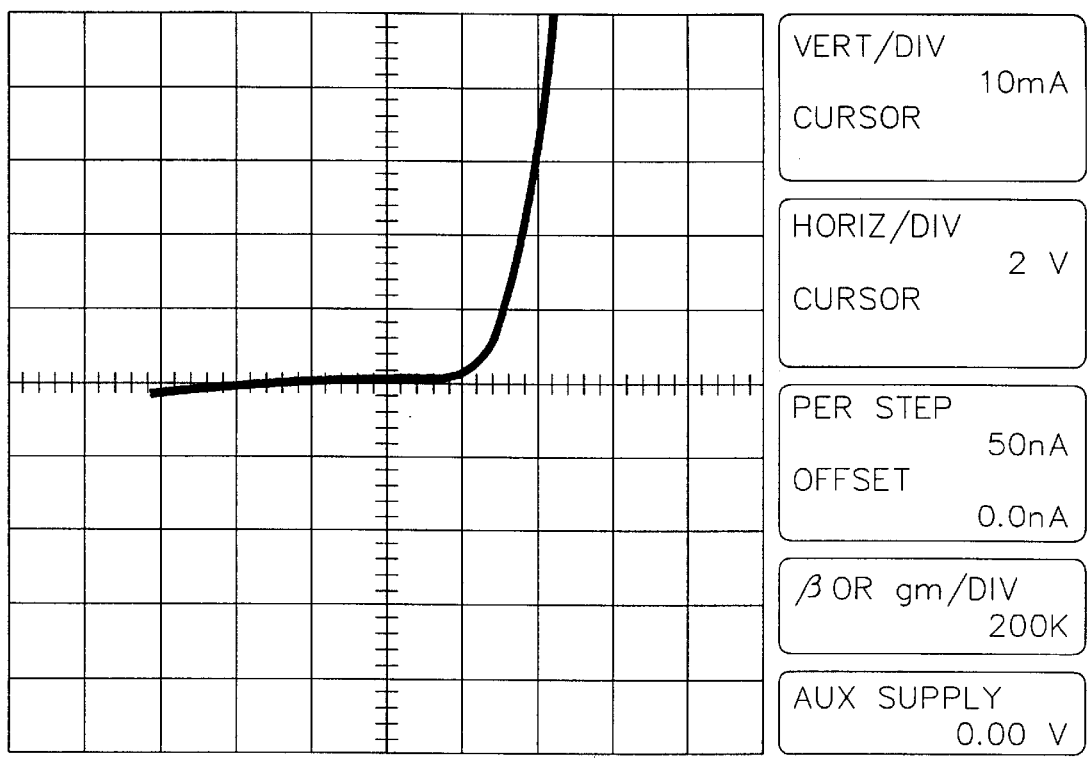

FIG. 10a illustrates the current-voltage relationship of an earlier device which used lithium as the p-type dopant and gold as the electrical contact to the p-type zinc selenide layer. As shown, about 10V is required to obtain 1 mA current under forward bias conditions for a diode having a cross sectional area of $10^{-3}$ cm$^2$. FIGS. 10b–10d illustrate diodes including zinc selenide and mercury selenide layers, according to the present invention. As shown, these diodes of cross-sectional area $10^{-3}$ cm$^2$ turn on at a much lower voltage (2.1V to obtain 1 mA, 3.2V to obtain 10 mA and 4.4V to obtain 50 mA as shown in FIGS. 10b–10d, respectively). This dramatic increase in current at a given voltage compared with earlier diodes provides clear evidence that the ohmic contact of the present invention is effective.

Figure 11:
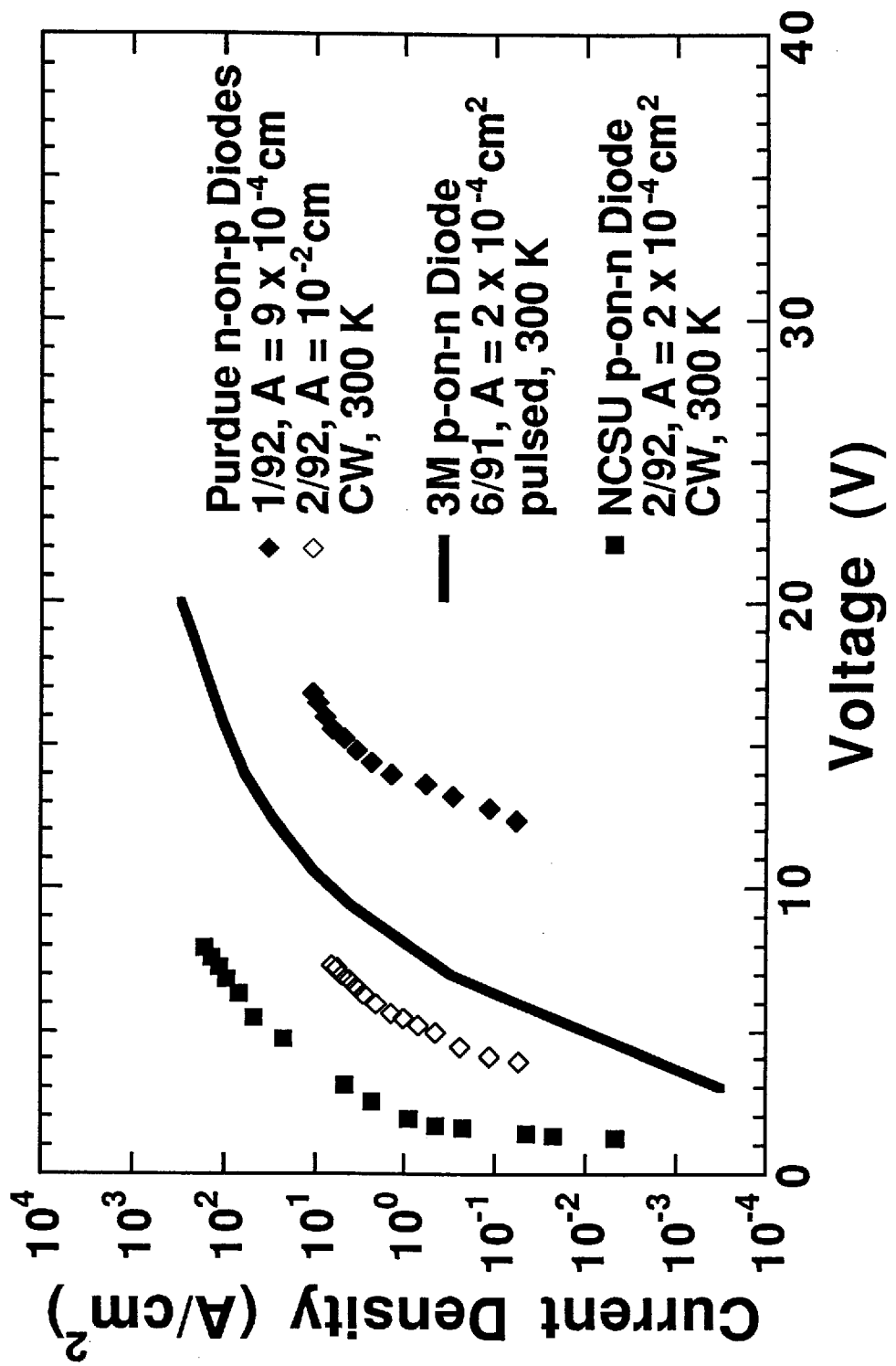
FIG. 11 is a graphical illustration of the current-voltage relationship among known light emitting diodes and light emitting diodes fabricated according to the present invention.

FIG. 11 graphically compares the diodes fabricated according to the present invention as described above ("NCSU p-on-n diodes 2/92") with those produced by 3M and Purdue. As shown, the p-on-n diodes of the present invention are substantially improved from those reported by 3M. Indeed, the diodes of the present invention are substantially better than the Purdue results for n-on-p diodes, particularly when diodes of similar cross-sectional areas are compared.

Figure 12:
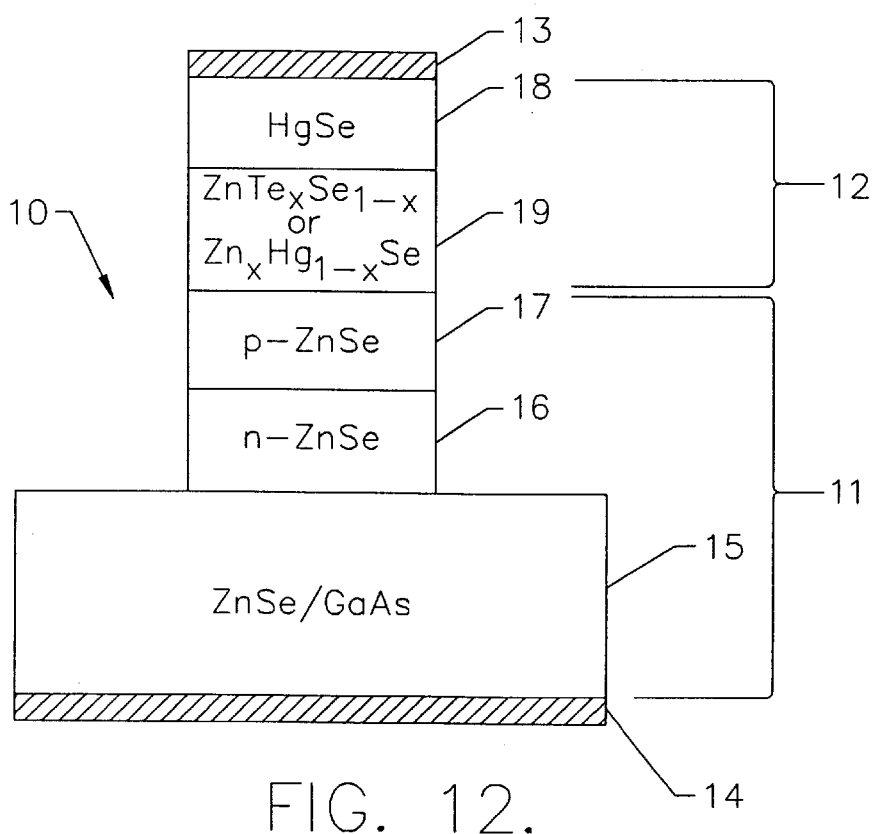
FIG. 12 is a cross-sectional illustration of a second embodiment of the present invention.

Referring now to FIG. 12, a second integrated heterostructure 20 is shown which includes a further improved ohmic contact from that of FIG. 1. As shown in FIG. 12, the optical heterostructure 11 is identical to that of FIG. 1. However, the electrical heterostructure comprises a layer of zinc mercury selenide($Zn_xHg_{1-x}Se$) 19 between layer of mercury selenide 18 and the p-type zinc selenide layer 17. The layer of mercury selenide 18 and the layer of zinc mercury selenide 19 provide an improved ohmic contact between p-type zinc selenide layer 17 and conductor 13.

Figure 13:
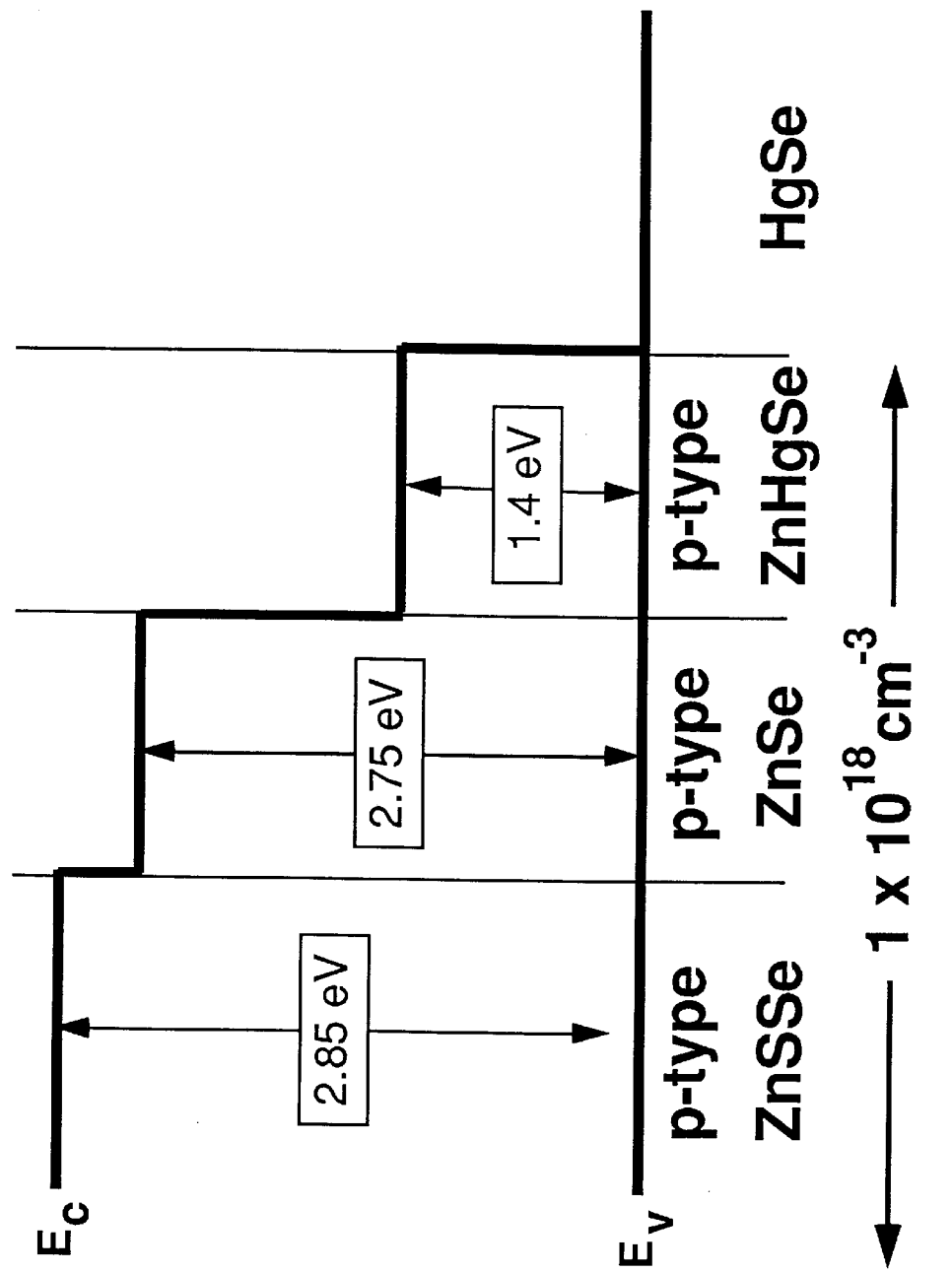
FIG. 13 is an energy band diagram for the device shown in FIG. 12, including a step graded zinc mercury selenide layer.

According to the invention, alternative embodiments of zinc mercury selenide layer 19 can provide an ohmic contact. In one embodiment, zinc mercury selenide layer 19 is a step graded layer having uniform ratio of zinc to mercury across the entire thickness thereof. A preferred uniform ratio for this layer is about 1:1. FIG. 13 illustrates the energy band diagram for such a step graded zinc mercury selenide layer. Preferably the step graded layer of zinc mercury selenide is doped p-type with the same doping concentration (e.g. $10^{18}$) as the zinc selenide layer.

Figure 14:
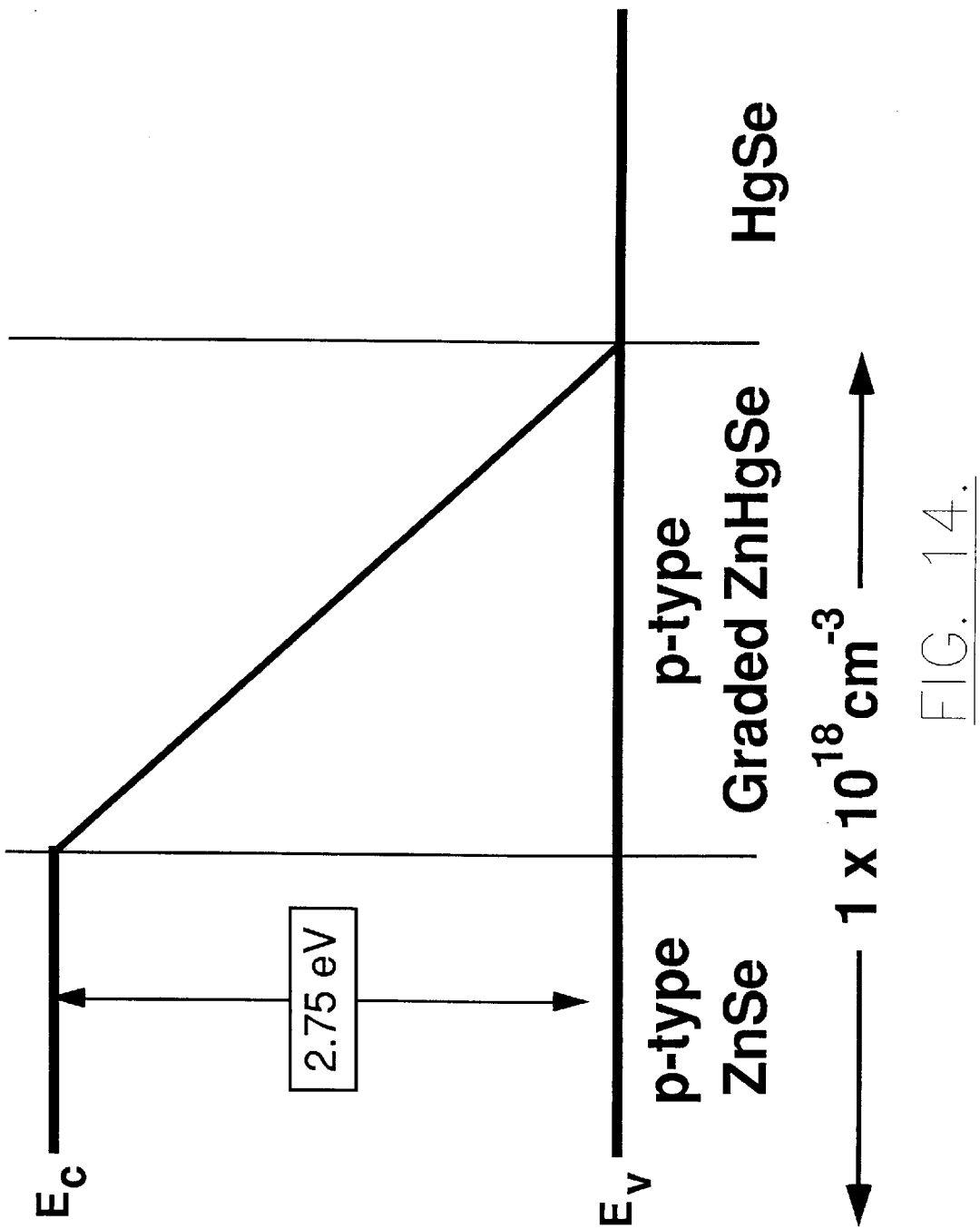
FIG. 14 is an energy band diagram for the device shown in FIG. 12, including a linear graded zinc mercury selenide layer.

Another alternative is shown in FIG. 14 wherein the amount of mercury increases linearly across the zinc mercury selenide layer, from the zinc selenide layer to the mercury selenide layer, to thereby provide a linear graded zinc mercury selenide layer. Preferably, the linear graded layer of zinc mercury selenide is doped p-type with the same doping concentration as the p-type zinc selenide(e.g. $10^{18}$).

Figure 15:
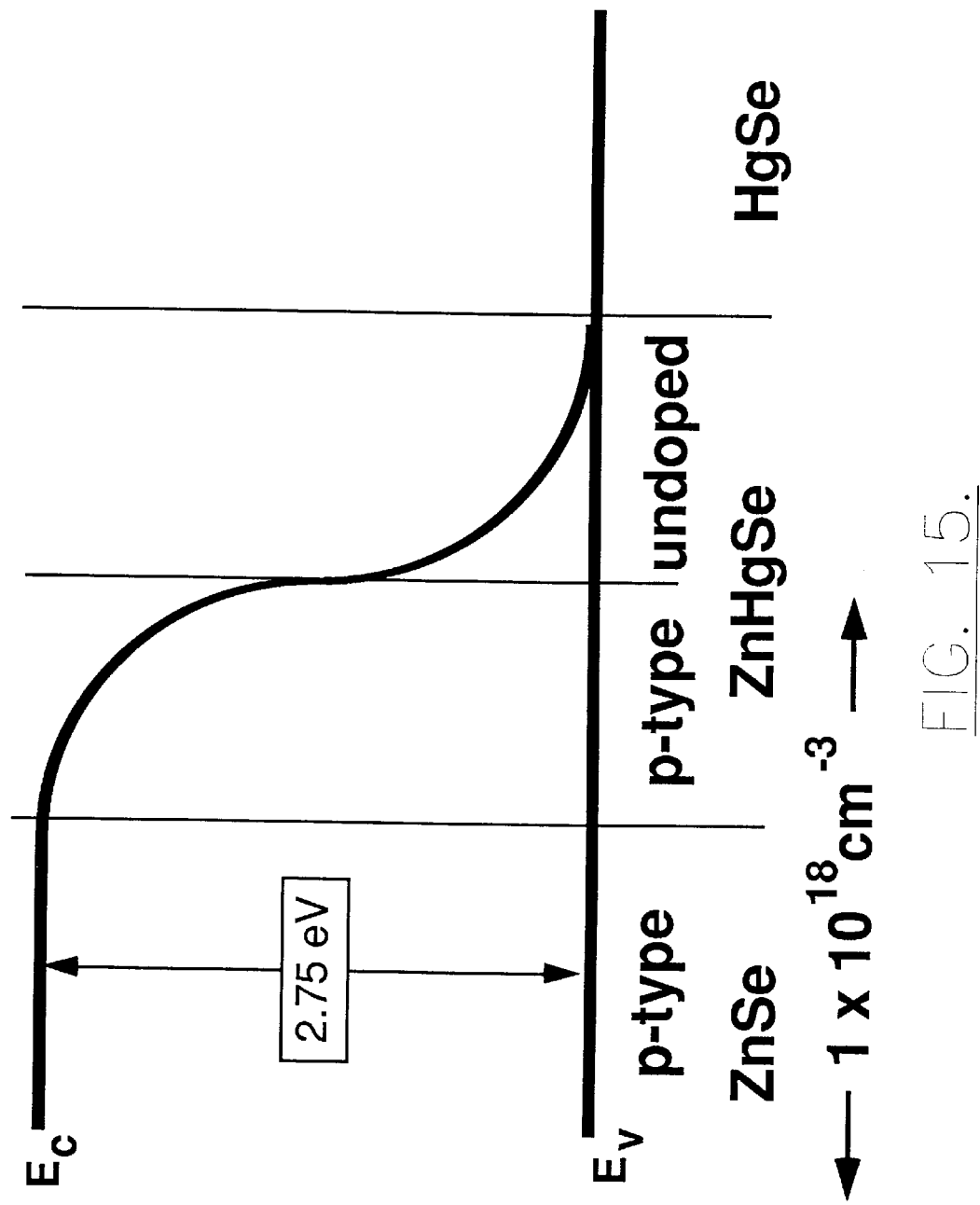
FIG. 15 is an energy band diagram for the device shown in FIG. 12, including a parabolic graded zinc mercury selenide layer.

Referring now to FIG. 15, the most preferred embodiment, presently contemplated by the inventor, is a parabolic graded zinc mercury selenide layer. As further shown in FIG. 15, at least part of the zinc mercury selenide layer is doped p-type, and preferably a portion of the zinc mercury selenide layer adjacent the zinc selenide layer is doped p-type. Most preferred is a configuration wherein half the thickness of the zinc mercury selenide layer adjacent the zinc selenide layer is doped p-type, with the same doping concentration as the zinc selenide, and with half the layer adjacent the mercury selenide being undoped. In one configuration, the zinc mercury selenide layer is 1200 Å thick, with 600 Å adjacent the zinc selenide layer being doped p-type at $10^{18}$ carriers per cubic centimeter to match that of the p-type zinc selenide, and with 600 Å adjacent the mercury selenide being undoped.

Figure 16A:
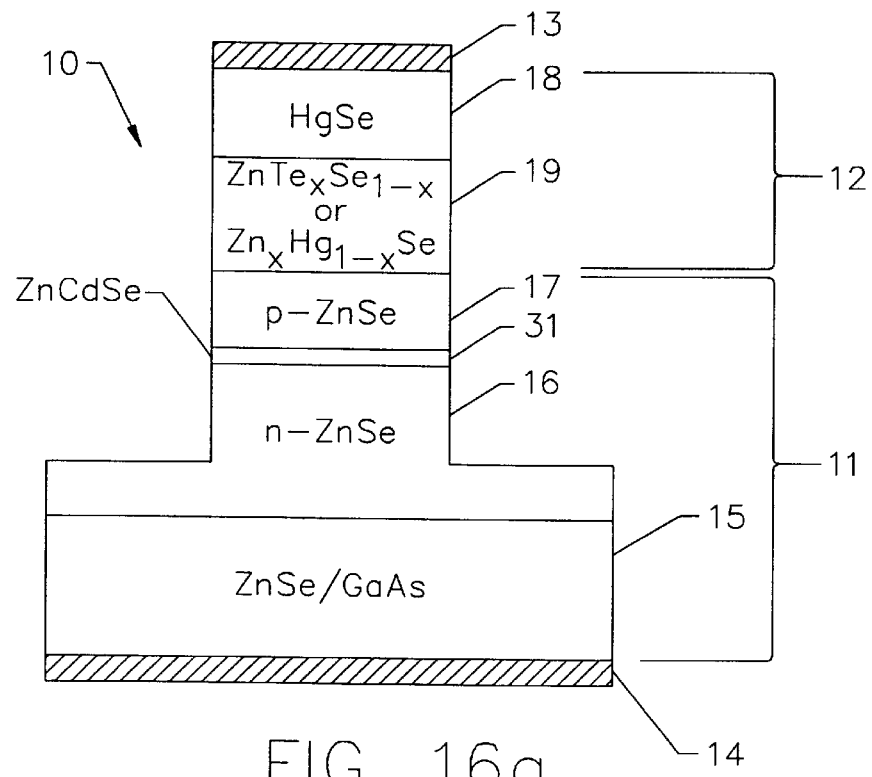
FIGS. 16a–16p are cross-sectional illustrations of alternative combinations of integrated heterostructures according to the present invention.
Figure 16B:
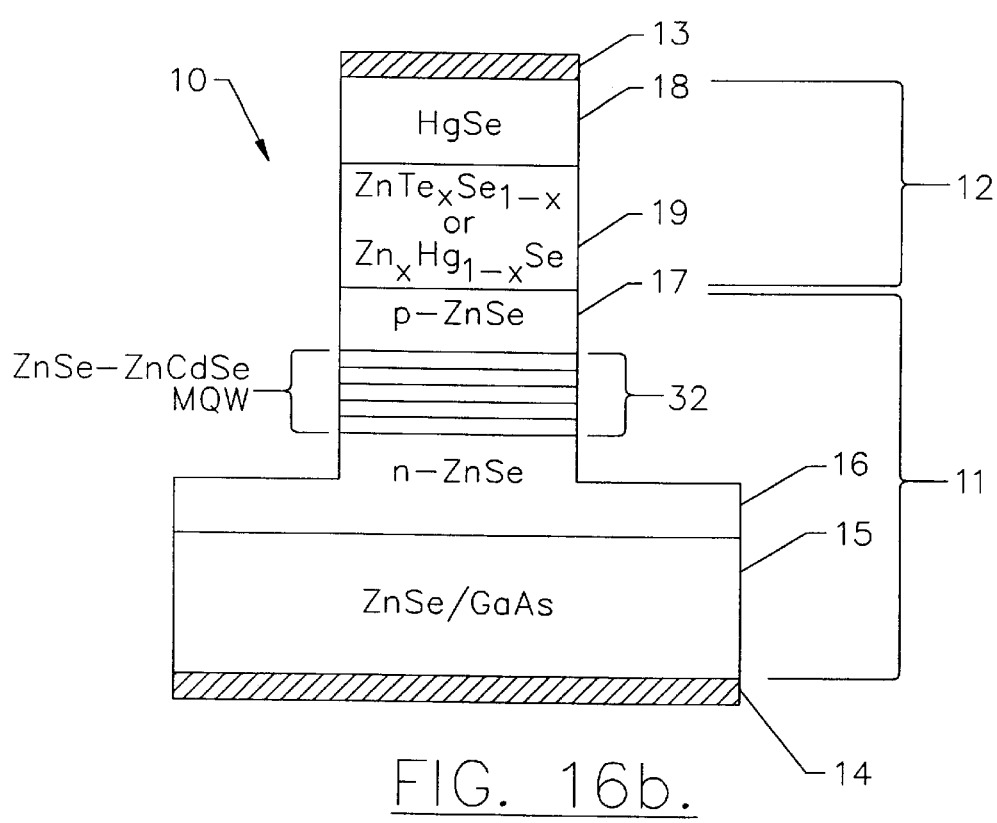
Figure 16C:
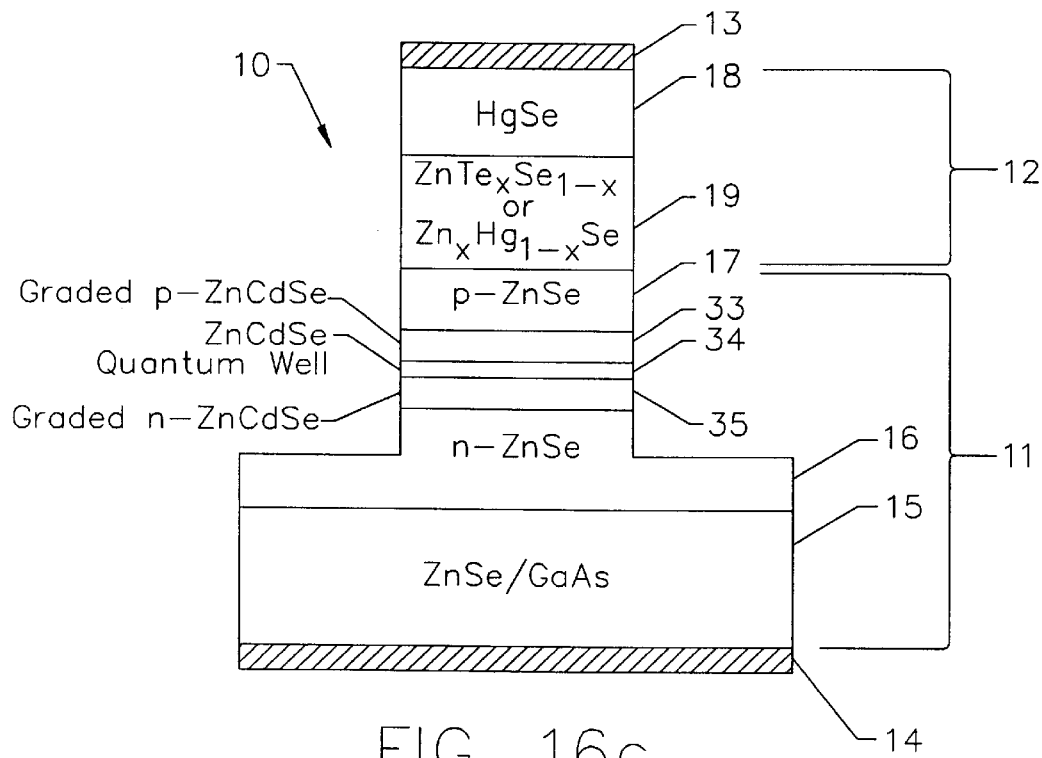
Figure 16D:
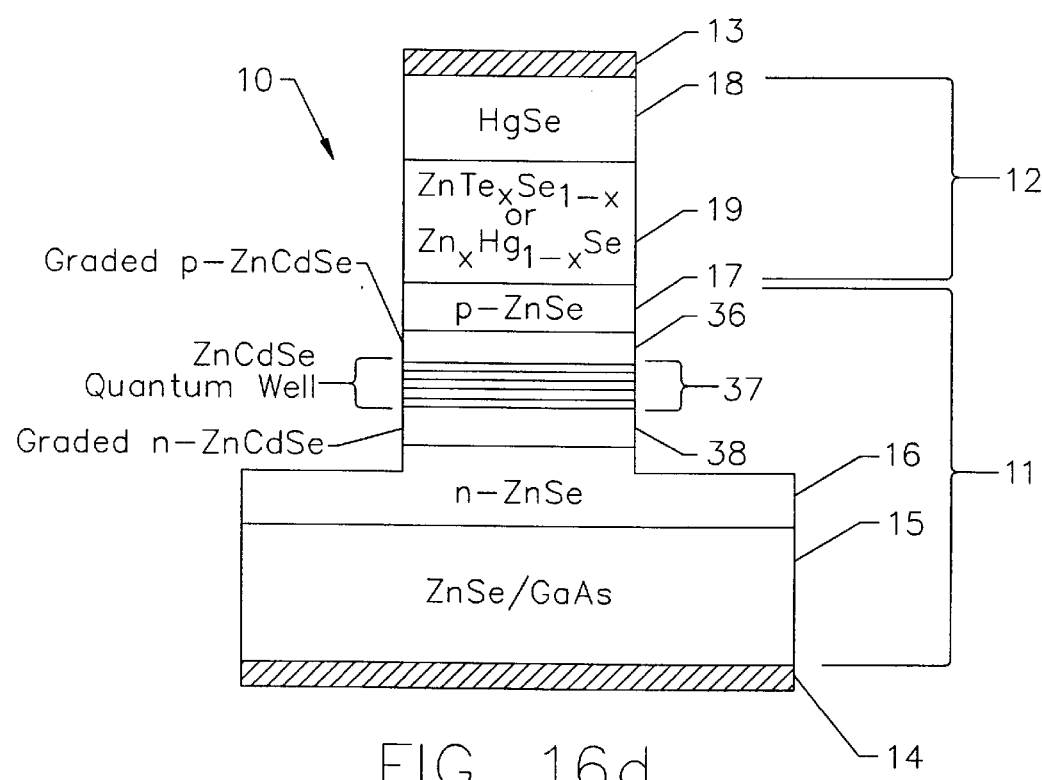
Figure 16E:
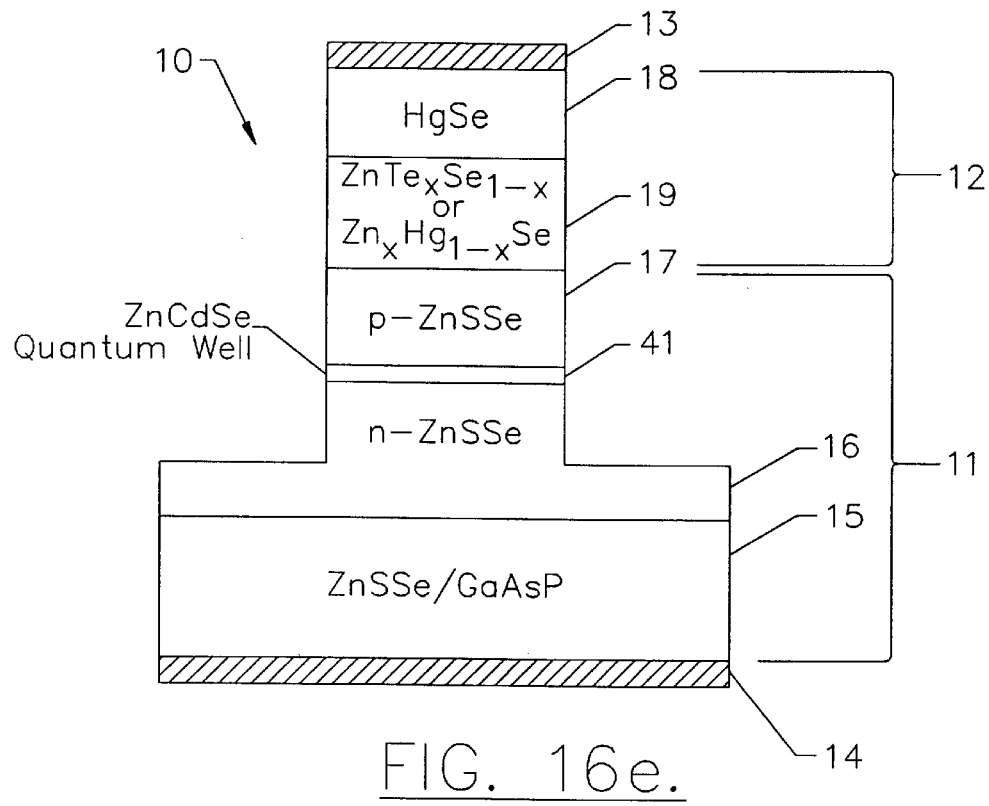
Figure 16F:
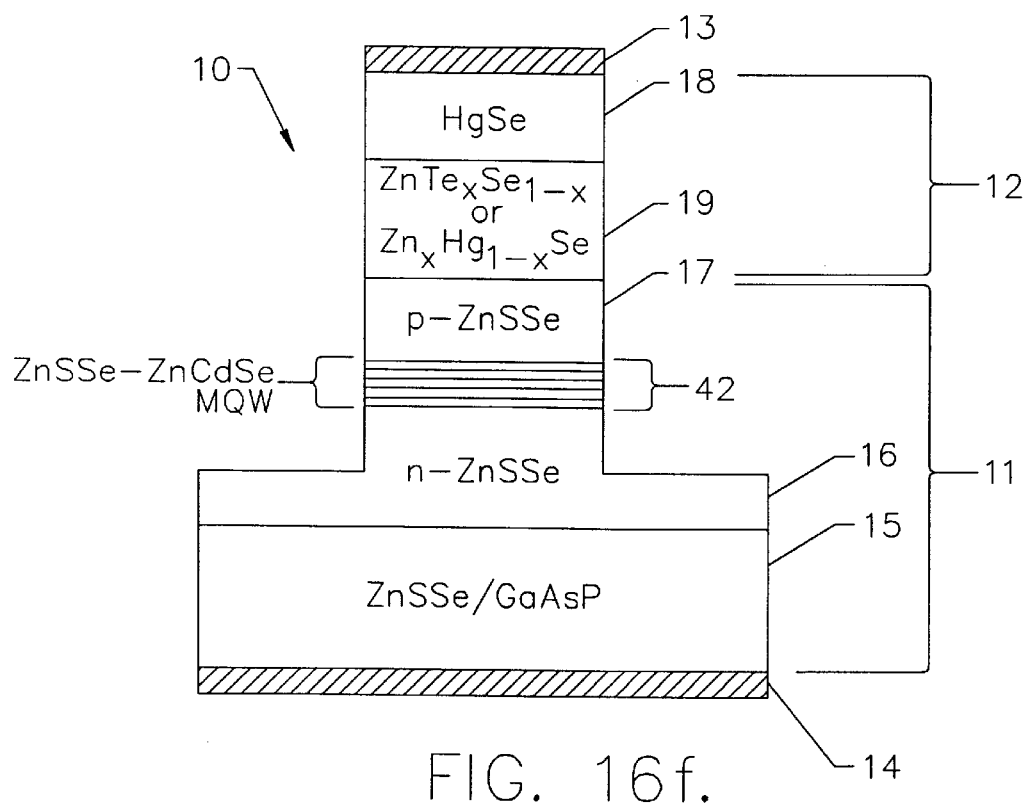
Figure 16G:
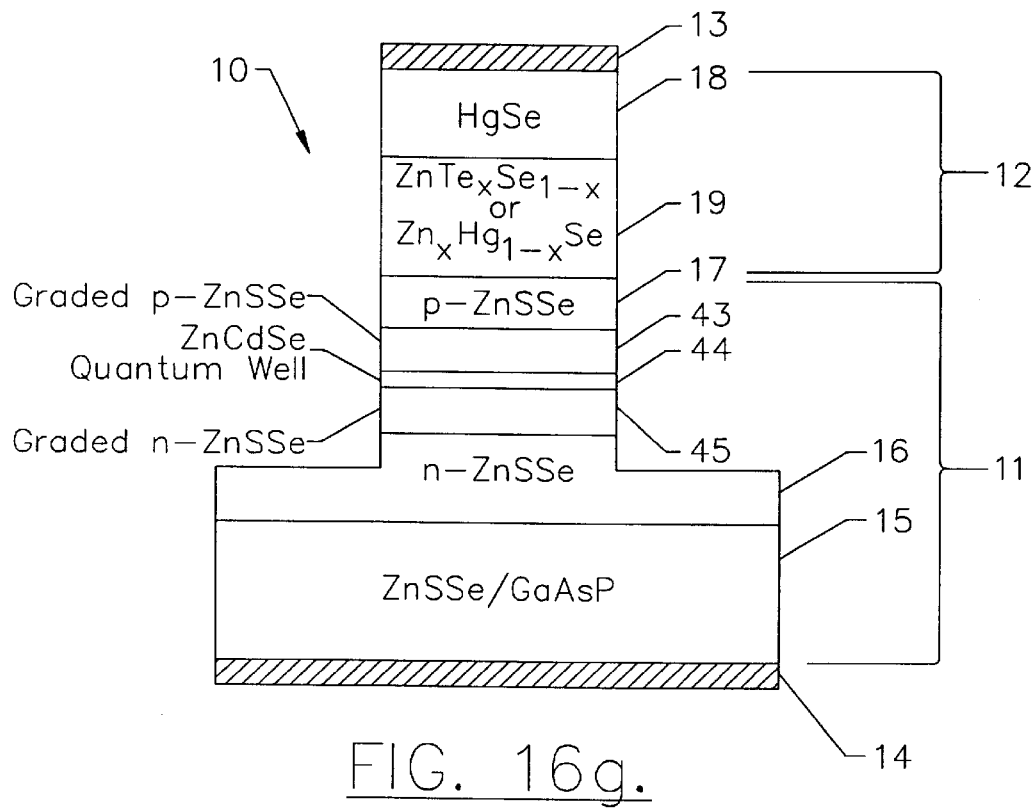
Figure 16H:
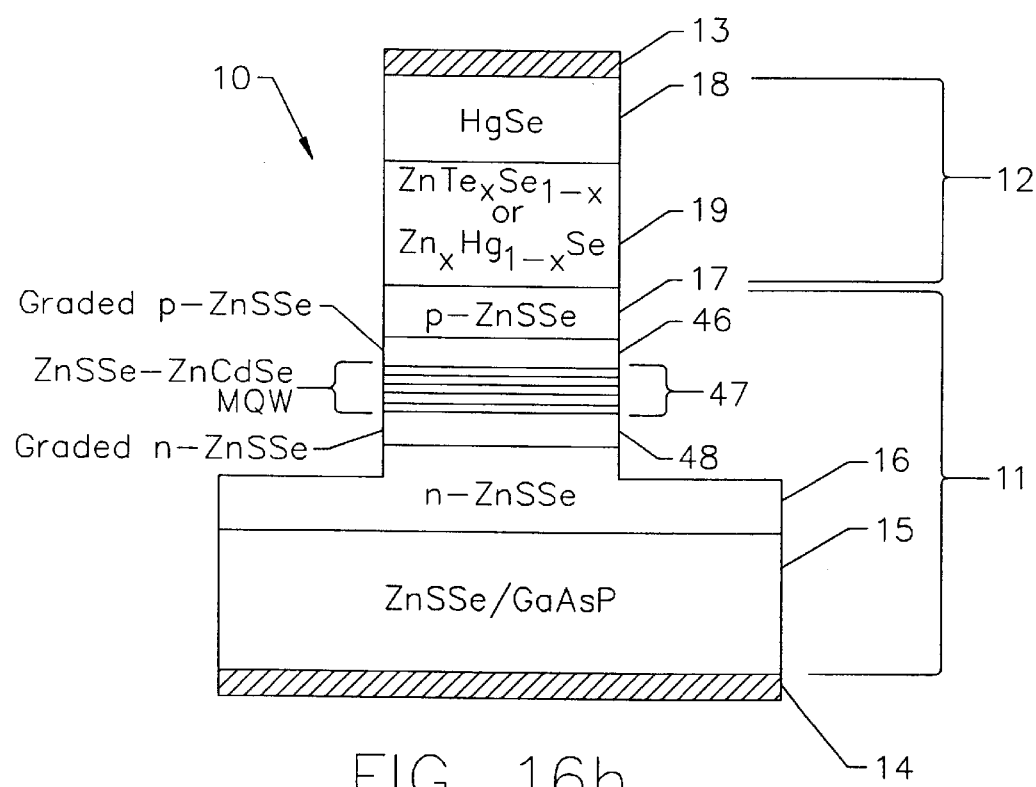
Figure 16I:
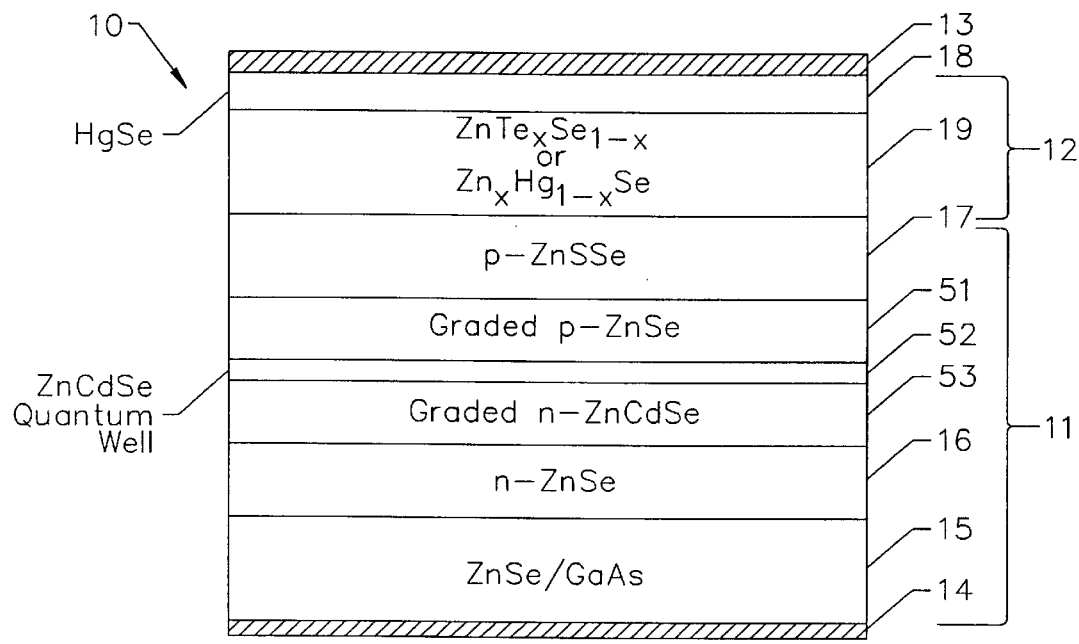
Figure 16J:
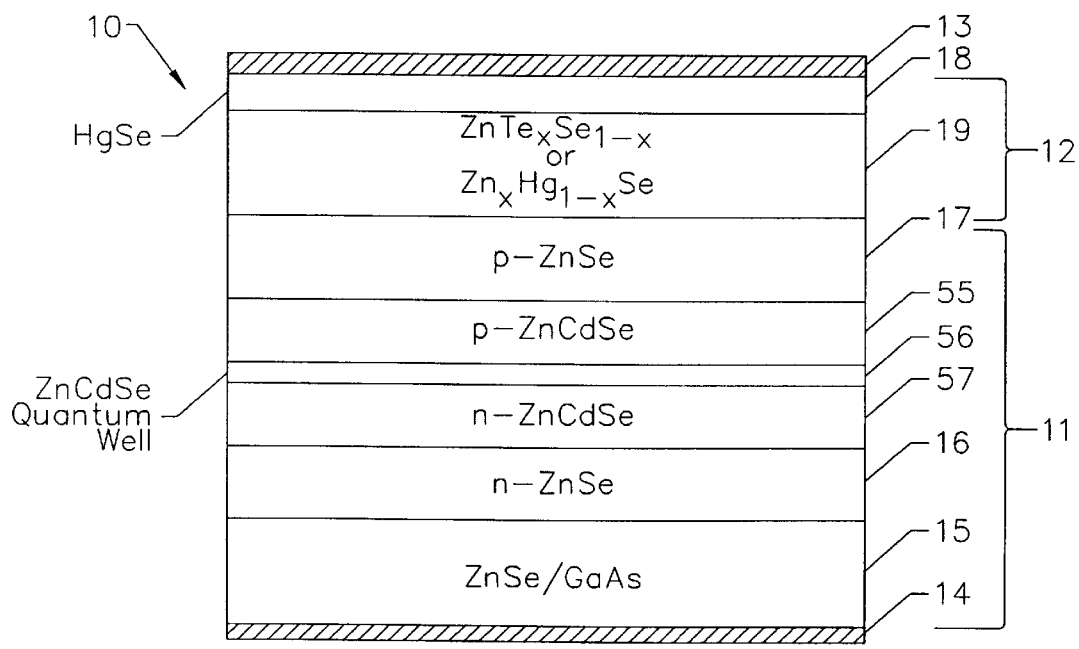
Figure 16K:
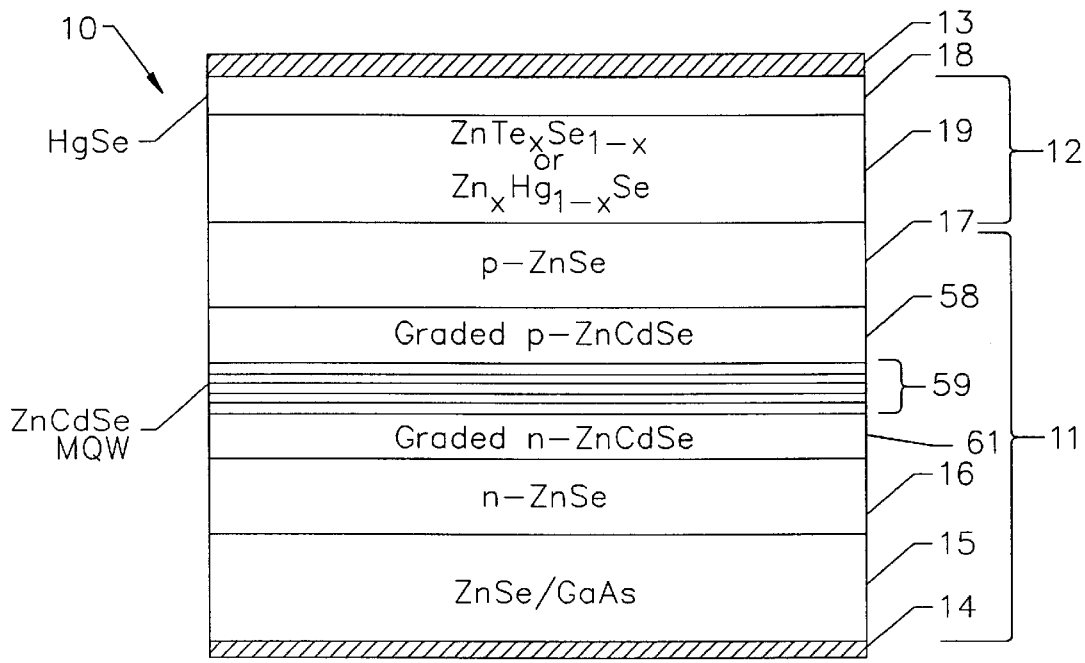
Figure 16L:
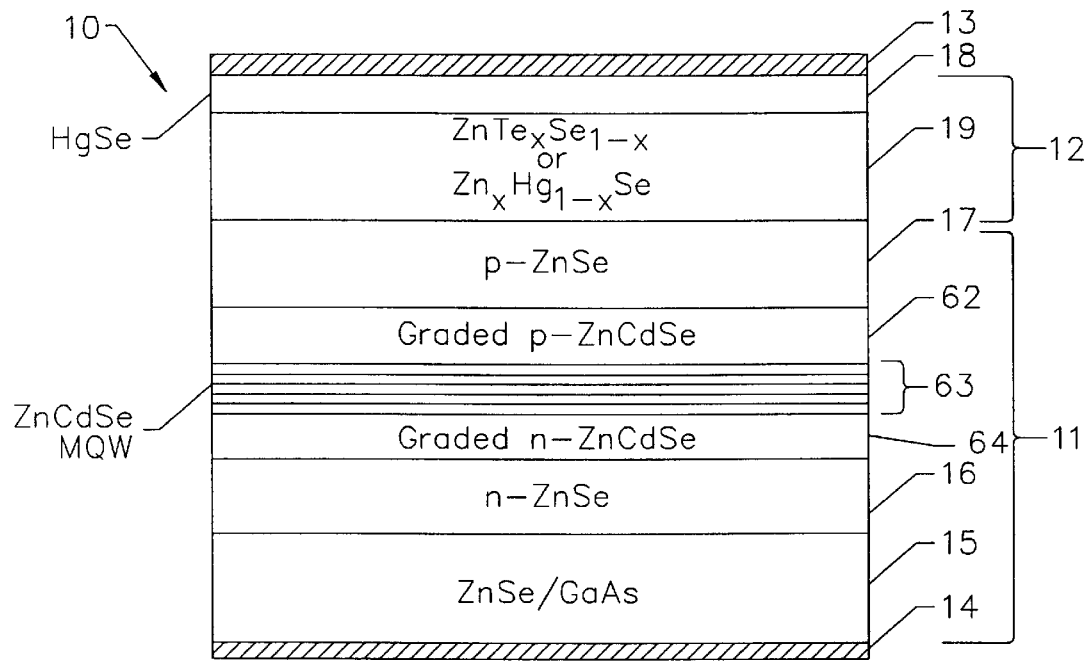
Figure 16M:
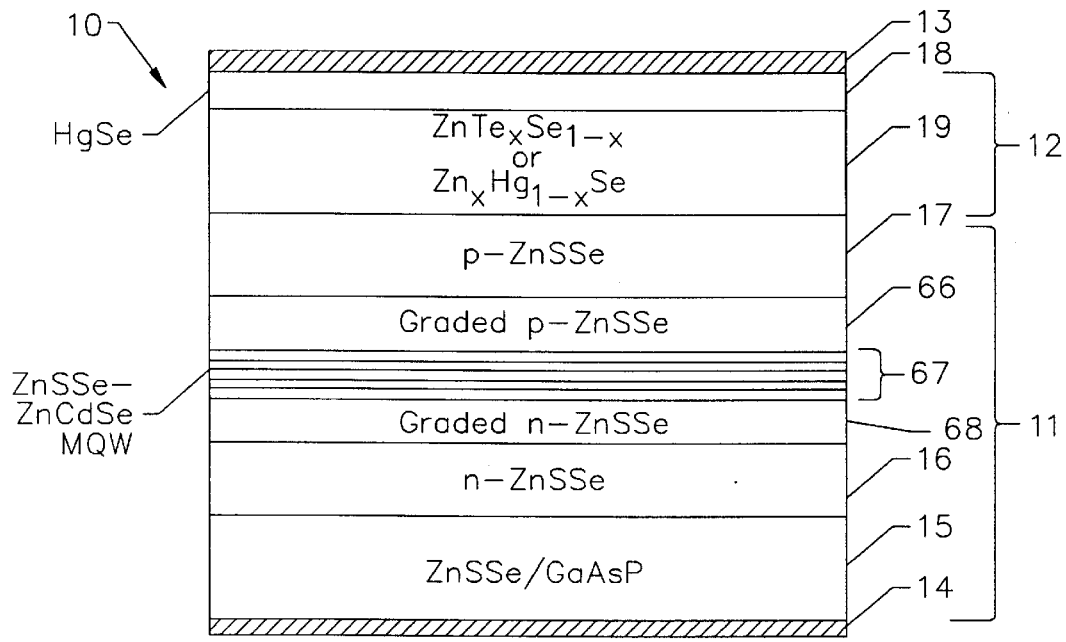
Figure 16N:
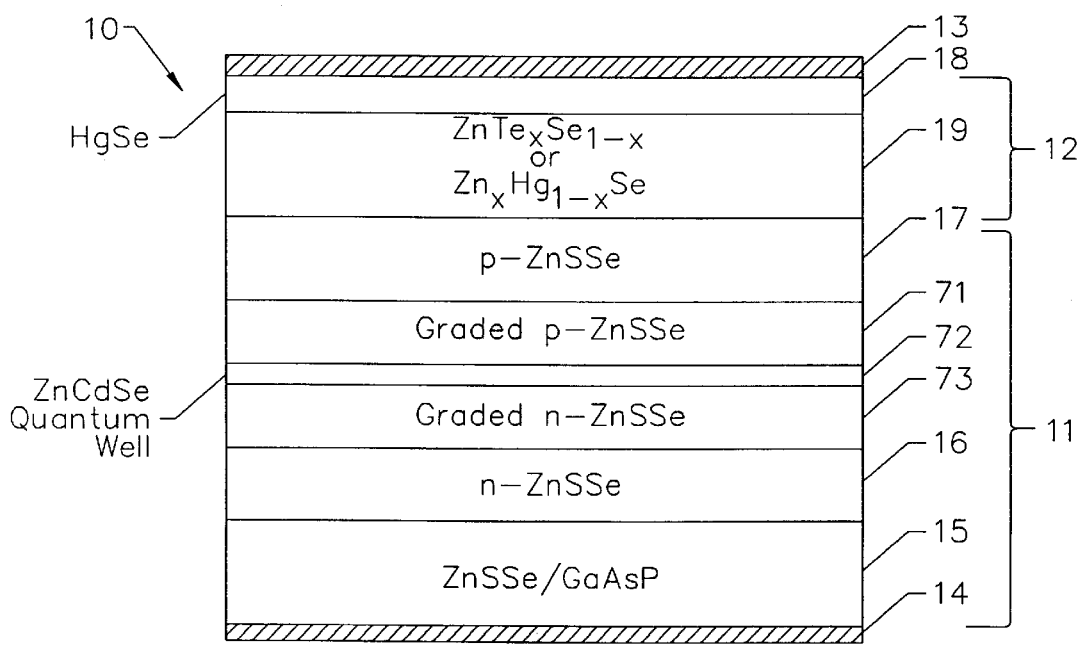
Figure 16O:
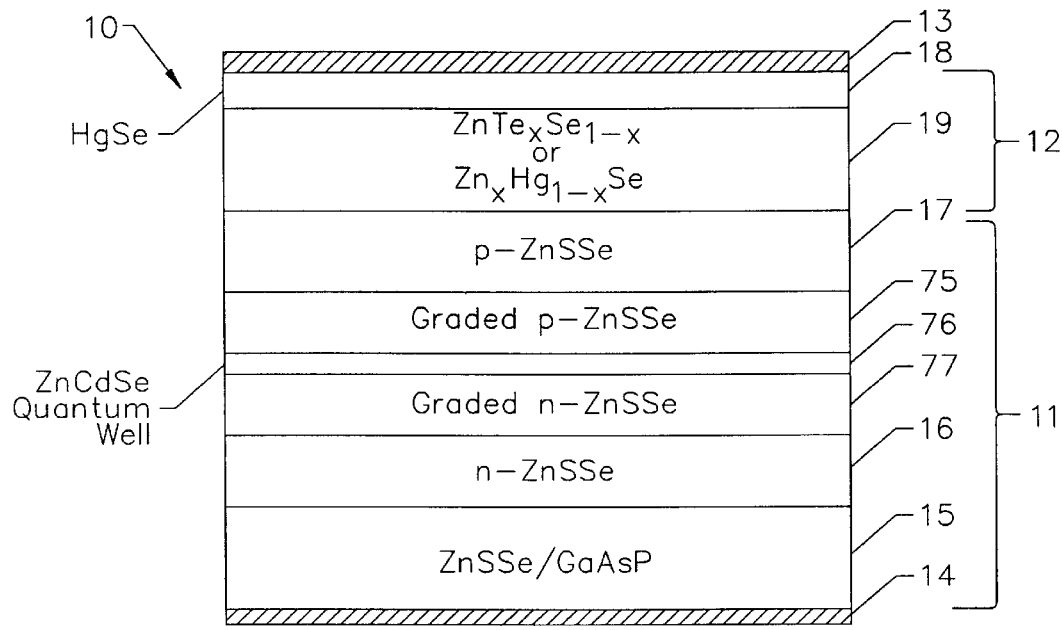
Figure 16P:
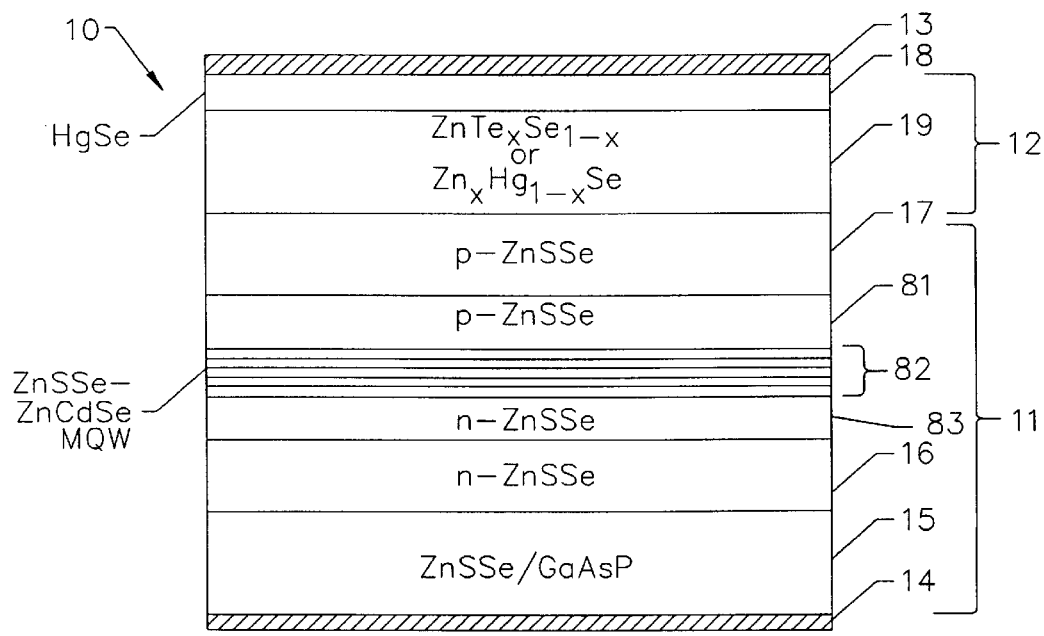

It will be understood by those having skill in the art that any of the ohmic contacts 12 of the present invention may be combined with any Group II–VI device to form an integrated heterostructure device, FIGS. 16a–16p illustrate various combinations.

FIGS. 16a–16d illustrate green LEDs. In particular, FIG. 16a illustrates a mesa diode green LED including a ZnCdSe quantum well 31. FIG. 16b illustrates a multiple quantum well (MQW) mesa diode green LED including an MQW 32 of ZnSe and ZnCdSe. FIG. 16c illustrates a GRaded Index Separate Confinement Heterostructure ("GRINSCH") mesa diode green LED including a layer of graded p-type ZnCdSe 33, a ZnCdSe quantum well 34 and graded n-type ZnCdSe 35. FIG. 16d illustrates a GRINSCH-MQW mesa diode green LED including a graded layer of p-type ZnCdSe 36 and a layer of ZnCdSe 37, and a graded layer of n-type ZnCdSe 38.

FIGS. 16e–16h illustrate blue LEDs. FIG. 16e illustrates a mesa diode blue LED including p- and n-type layers of zinc sulfur selenide and a zinc cadmium selenide quantum well 41. FIG. 16f illustrates an MQW mesa diode blue LED including an MQW 42 of zinc sulfur selenide and zinc cadmium selenide. FIG. 16g illustrates a GRINSCH mesa diode blue LED including a layer graded p-type zinc sulfur selenide layer 43, a zinc cadmium selenide quantum well 44 and a graded n-type zinc sulfur selenide layer 45. FIG. 16h illustrates a GRINSCH MQW blue LED including a graded layer of p-type zinc sulfur selenide 46, an MQW of zinc sulfur selenide and zinc cadmium selenide 47, and a graded layer of n-type zinc sulfur selenide 48.

FIGS. 16i–16l illustrate green lasers. FIG. 15i illustrates a GRINSCH green laser, including a graded layer of p-type zinc cadmium selenide 51, a zinc cadmium selenide quantum well 52, and a graded layer of n-type zinc cadmium selenide 53. FIG. 16j illustrates a separate confinement green laser formed by a layer of p-type zinc cadmium selenide 54, a zinc cadmium selenide quantum well 56 and an n-type zinc cadmium selenide layer 57. FIG. 16k illustrates a GRINSCH MQW green laser including a graded layer of p-type zinc cadmium selenide 58, a zinc cadmium selenide MQW 59 and a graded layer of n-type zinc cadmium selenide 61. A separate confinement MQW green laser is shown in FIG. 16l including a p-type layer of zinc cadmium selenide 62, a zinc cadmium selenide MQW 63 and n-type zinc cadmium selenide layer 64.

FIGS. 16m–16p illustrate blue lasers. In particular, FIG. 16m illustrates a GRINSCH MQW blue laser formed of graded p-type zinc sulfur selenide layer 66, an MQW 67 of zinc sulfur selenide and zinc cadmium selenide, and a graded layer of n-type zinc sulfur selenide 68. FIG. 16n illustrates a GRINSCH blue laser including graded p-type zinc sulfur selenide layer 71, a zinc cadmium selenide layer quantum well 72 and a graded n-type zinc sulfur selenide layer 73. FIG. 15o illustrates a separate confinement blue laser including a p-type layer of zinc sulfur selenide 75, a zinc cadmium selenide quantum well 76 and an n-type zinc sulfur selenide layer 77. Finally, FIG. 15p illustrates a separate confinement MQW blue laser including a p-type layer of zinc sulfur selenide 81, an MQW of zinc sulfur selenide and zinc cadmium selenide 82, and an n-type layer of zinc sulfur selenide 83.

Each of the structures of FIGS. 15a–15p includes the ohmic contact shown in FIG. 12, including a layer of mercury selenide 18 and a graded zinc mercury selenide layer 19. The ohmic contact of FIG. 1, which includes a mercury selenide layer 18 and is free of a zinc mercury selenide layer 19, may also be used. It will be understood that other configurations of the electrical structure 11 may also be used.

It will also be understood that in any of the heterojunctions previously described, band discontinuities can be reduced or eliminated by modulation doping. Modulation doping is a technique which is well known to those having skill in the art, and is described for Group III–V semiconductors in an article by Shupert et al. entitled *Elimination of Heterojunction Band Discontinuities By Modulation Doping*, Applied Physics Letters, Vol. 16, No. 4, January 1992, pp. 466–468.

Techniques for fabricating the ohmic contacts of the present invention will now be described. At present, molecular beam epitaxy (MBE) is the preferred deposition technique for preparing integrated heterostructure devices of Group II–VI compound semiconductors for blue to green light emitter applications. This is because p-type doping is possible using nitrogen excited in a remote-plasma-enhanced MBE source, such as the model MPD21 marketed by Oxford Applied Research, Oxfordshire, England. Organometallic vapor deposition (OMCVD) is a second potential deposition technique for growing integrated heterostructure devices, if p-type doping is developed. At present, p-type doping of zinc selenide and related alloys by OMCVD has not been demonstrated, to the best of the inventor's knowledge.

The integrated heterostructure devices of the present invention may be fabricated using a two chamber MBE deposition system. A first deposition chamber may be used exclusively for the deposition of wide bandgap Group II–VI semiconductor layers including zinc selenide, zinc cadmium selenide and zinc sulfur selenide, to grow the optical portion 11 of the integrated heterostructure device according to any of the structures described above or any other Group II–VI optical structure. The sample is then transferred to a second chamber where mercury selenide, or zinc mercury selenide and mercury selenide, is heteroepitaxially formed on the p-type zinc selenide. A second chamber is typically required because of the special requirements for depositing mercury based materials which are necessitated by the extremely high vapor pressure of mercury (about 3 mTorr at room temperature). Accordingly, as is well known to those having skill in the art, special MBE sources, cryoshrouding and other special techniques may need to be employed.

Figure 17:
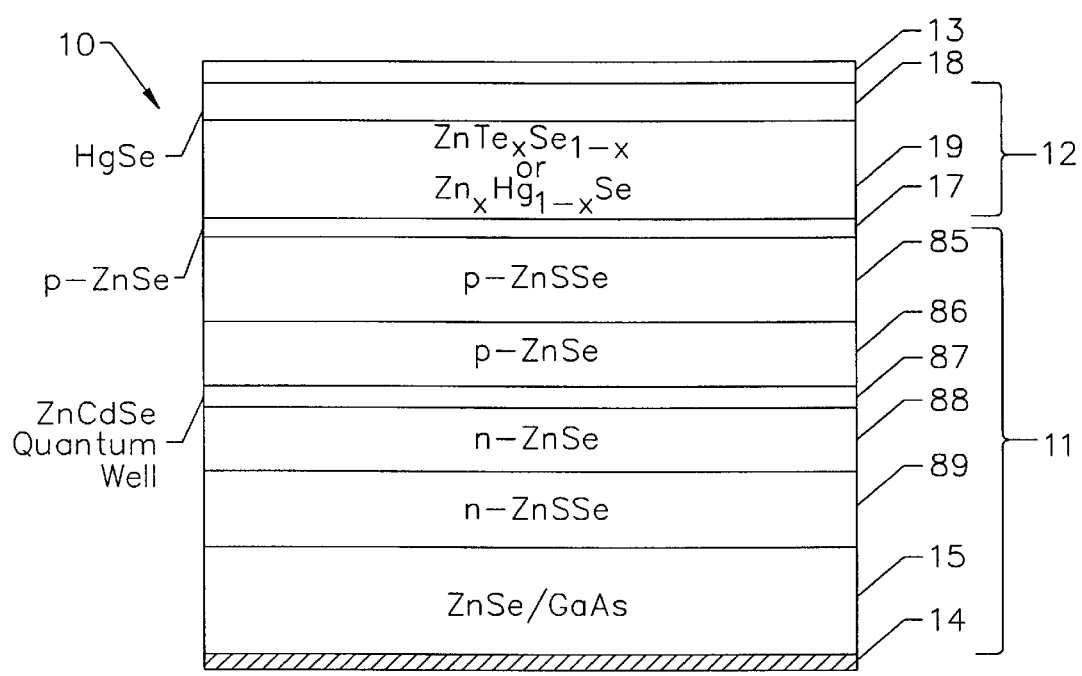
FIG. 17 illustrates another integrated heterostructure according to the present invention.

A detailed process for forming a separate confinement green laser having an ohmic contact according to the present invention will now be described. The laser structure is shown in FIG. 17 and includes an optical heterostructure 11 comprising a zinc cadmium selenide quantum well 87 between p- and n-type zinc selenide layers 86 and 88, respectively, which are placed between p-and-n zinc sulfur selenide layers 85 and 89, respectively. The optical heterostructure 11 is formed on substrate 15 and includes a top layer 17 of p-type zinc selenide. The ohmic contact heterostructure comprises a layer of graded zinc mercury selenide 19 and a layer of mercury selenide 18 between metal electrode 13 and p-type zinc selenide layer 17.

Conventional substrate preparation processes are used to form an n+ gallium arsenide or zinc selenide substrate 15. Epitaxial growth of the p-on-n heterostructure is initiated at a substrate temperature of 220°–260° C. Chlorine, in the form of the solid zinc chloride, is presently the preferred n-type dopant for the n-type zinc sulfur selenide layer 89 and the n-type zinc selenide optical confinement layer 88. Doping levels for layers 88 and 89 should be about $10^{18}$ cm$^{-3}$. The zinc cadmium selenide quantum well 87 is then deposited, followed by the p-type zinc selenide layer 86 and the p-type zinc sulfur selenide layer 85.

Two techniques may be used to effectively form layers 17, 18 and 19 on layer 85. A first technique transfers the already completed structure into a second chamber under ultrahigh vacuum, using commercially available ultrahigh vacuum interlocking systems or a portable ultrahigh vacuum wafer transfer device. Alternatively, a second technique avoids the need to transfer the optical heterostructure to a second deposition chamber under ultrahigh vacuum by forming a thin overcoat layer, for example selenium, on the structure.

Figure 18A:
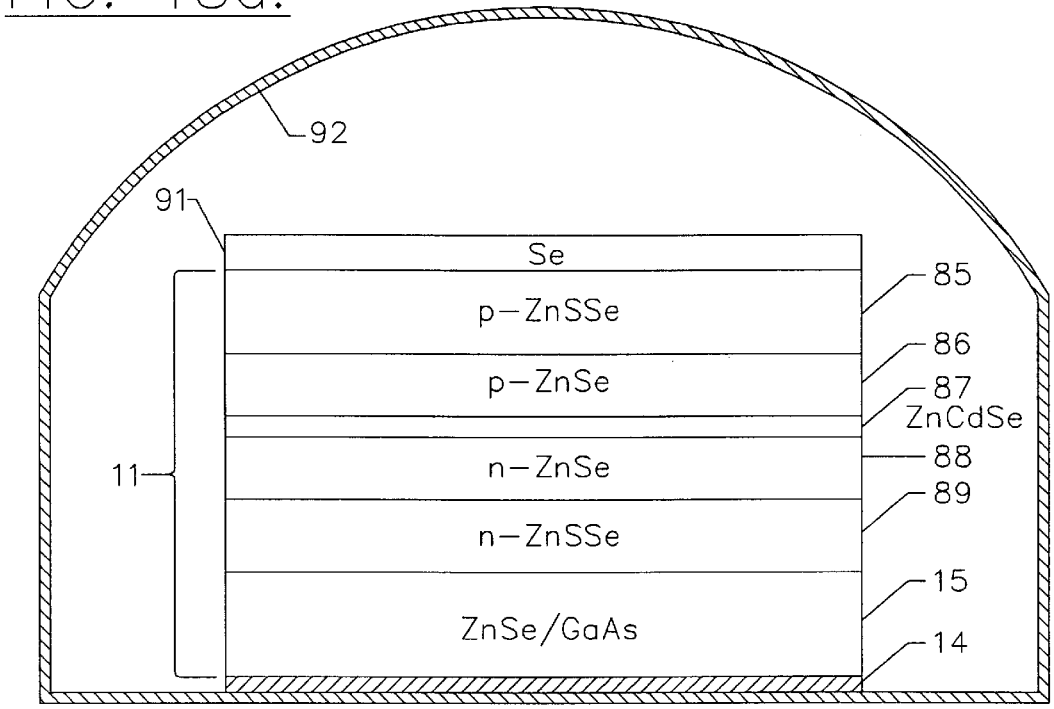
FIGS. 18a and 18b illustrate steps for forming the integrated heterostructure of FIG. 17 according to the present invention.
Figure 18B:
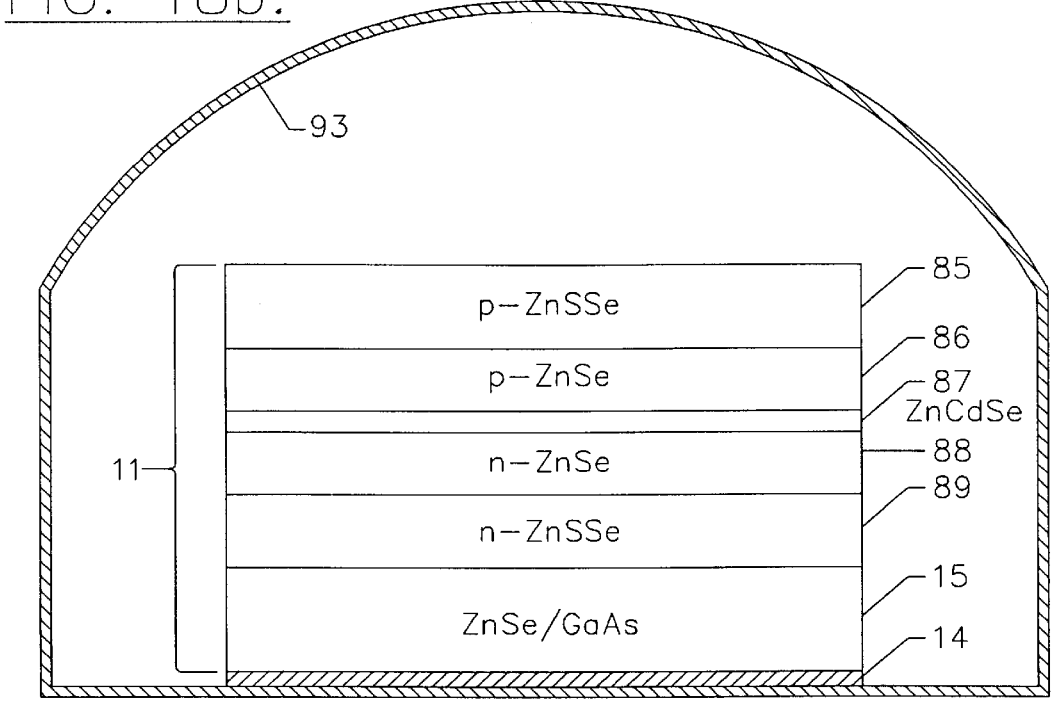

FIGS. 18a and 18b illustrate the use of the selenium overcoat layer. Referring to FIG. 18a, a thin (e.g. about 0.1 $\mu$m) layer of selenium 91 may be formed in the first chamber 92 after the deposition sequence described above. The selenium layer deposition may take place at room temperature. Then, the sample can be removed from the first chamber 92 and inserted into a second chamber 93 for mercury based heterostructure growth. In the second chamber 93, the selenium layer 91 may be evaporated by heating the substrate at 300° C. for several minutes just prior to mercury based film growth to obtain the structure of FIG. 18b.

Once the sample in chamber 93 is ready for deposition, a thin (approximately 200 Å) p-type layer of zinc selenide 17 is deposited followed by a graded p-type zinc mercury selenide region 19, and a thin (approximately 200 Å) layer of mercury selenide 18. The exact thickness of the layers is not critical. Preferably, at least part or all of the graded zinc mercury selenide layer is doped p-type to effectively eliminate band discontinuities. At present, nitrogen from a remote plasma source is the preferred p-type dopant. During deposition of the $Zn_xHg_{1-x}Se$ graded layer, in which the x value is graded from x=1 to x=0, the substrate temperature is preferably reduced from about 220°–260° C. initially to about 100° C. in order to effectively incorporate the mercury into the graded zinc mercury selenide layer 19. Zinc and selenium fluxes must also be adjusted for proper growth of the zinc mercury selenide layer. If this adjustment is not done, practically all of the mercury reevaporates and grading of the layer does not occur. The final mercury selenide layer 18 is then deposited at about 100° C.

Similar procedures may be used to fabricate a variety of other integrated heterostructures for blue laser, blue LED, green laser and green LED applications, and other applications. The color output of a particular device is determined by the cadmium content of the zinc cadmium selenide layers in the active regions of the structure. The degree of optical confinement is determined by the sulfur content in the zinc sulfur selenide cladding layers. The graded structure of p-type doped zinc mercury selenide 19 further reduces the valance band offset between mercury selenide and zinc selenide and thus further reduces the series resistance of the ohmic contact. The series resistance and turn-on voltage of the optical device is thereby minimized.

It is also possible to grow p-on-n integrated heterostructure devices on insulating substrates. This might be desirable, for example, because of the limited availability of n-type ZnSe substrates at present. If an insulating substrate is employed, the multilayered growth sequence remains unchanged from that described above. However, the finished wafers are processed differently so that an ohmic contact can be made to the initial n-type epitaxial layer of the structure. This can be done by employing standard photolithography/etching techniques to define mesas and etch down to the n-type layer as shown in FIG. 16. A 1% bromine in methanol solution is a suitable etchant for the Hg-based layers. A solution of 1 gm potassium dichromate($K_2Cr_2O_7$), 10 ml sulfuric acid($H_2SO_4$), and 20 ml of deionized water is suitable for etching ZnSe and related alloys. Both solutions are compatible with available photoresists. Following this etching step, ohmic contact to the n-type layer can then be achieved by photolithographically defining and opening via regions to the n-type layer and depositing an appropriate metal such as indium, or indium/gold. Standard liftoff techniques can then be used to remove the deposited metal from unwanted areas of the structure.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed:

1. An ohmic contact for a semiconductor device formed of Group II–VI compound semiconductor materials and including a layer of p-type zinc selenide (ZnSe) or an alloy thereof, said ohmic contact comprising:
    a zinc mercury selenide ($Zn_xHg_{1-x}Se$) layer on said layer of p-type ZnSe or an alloy thereof, where $0<x<1$;
    a mercury selenide (HgSe) layer on said $Zn_xHg_{1-x}Se$ layer; and
    a conductor layer on said HgSe layer, said $Zn_xHg_{1-x}Se$ layer and said HgSe layer forming an ohmic contact between said p-type ZnSe or an alloy thereof, and said conductor layer.

2. The ohmic contact of claim 1 wherein x is constant in said $Zn_xHg_{1-x}Se$ layer to provide a step graded $Zn_xHg_{1-x}Se$ layer.

3. The ohmic contact of claim 1 wherein x decreases across said $Zn_xHg_{1-x}Se$ layer, from said ZnSe layer to said HgSe layer, to provide a graded $Zn_xHg_{1-x}Se$ layer.

4. The ohmic contact of claim 3 wherein x decreases linearly across said $Zn_xHg_{1-x}Se$ layer, from said ZnSe layer to said HgSe layer, to provide a linear graded $Zn_xHg_{1-x}Se$ layer.

5. The ohmic contact of claim 3 wherein x decreases nonlinearly across said $Zn_xHg_{1-x}Se$ layer, from said ZnSe layer to said HgSe layer, to provide a nonlinear graded $Zn_xHg_{1-x}Se$ layer.

6. The ohmic contact of claim 5 wherein x decreases parabolically across said $Zn_xHg_{1-x}Se$ layer, from said ZnSe layer to said HgSe layer, to provide a parabolic graded $Zn_xHg_{1-x}Se$ layer.

7. The ohmic contact of claim 6 wherein a first half of said $Zn_xHg_{1-x}Se$ layer adjacent said ZnSe is p-type, and a second half of said $Zn_xHg_{1-x}Se$ layer adjacent said HgSe layer is of neutral conductivity.

8. The ohmic contact of claim 1 wherein at least a portion of said $Zn_xHg_{1-x}Se$ layer is p-type.

9. The ohmic contact of claim 8 wherein said $Zn_xHg_{1-x}Se$ layer is p-type adjacent said ZnSe layer, and is of neutral conductivity adjacent said Hgse layer.

10. The ohmic contact of claim 1 wherein said zinc mercury selenide layer is p-type modulation doped.

11. An ohmic contact for a semiconductor device formed of Group II–VI compound semiconductor materials and including a layer of p-type Group II–VI compound semiconductor material, said ohmic contact comprising:
    a ternary compound Group II–VI semiconductor material on said layer of p-type Group II–VI compound semiconductor material;
    a Group II–VI semimetal on said ternary compound Group II–VI semiconductor material; and
    a conductor on said Group II–VI semimetal, said ternary compound Group II–VI semiconductor material and said Group II–VI semimetal forming an ohmic contact between said layer of p-type Group II–VI compound semiconductor material and said conductor.

12. The ohmic contact of claim 11 wherein said ternary compound Group II–VI semiconductor material is zinc mercury selenide.

13. The ohmic contact of claim 11 wherein said Group II–VI semimetal is mercury selenide.

14. The ohmic contact of claim 11 wherein said conductor is a metal.

15. The ohmic contact of claim 11 wherein said ternary compound Group II–VI semiconductor material and said Group II–VI semimetal form a monocrystalline heterostructure.

16. An ohmic contact for a semiconductor device formed of Group II–VI compound semiconductor materials and including a layer of p-type zinc selenide (ZnSe) or an alloy thereof, said ohmic contact comprising:
    a mercury selenide (HgSe) heterostructure on said p-type ZnSe layer; and
    a conductor layer on said HgSe heterostructure, said conductor layer being spaced from said p-type $Z_nS_e$ layer by said $H_gS_e$ heterostructure, said HgSe heterostructure forming an ohmic contact between said layer of p-type ZnSe and said conductor layer.

17. The ohmic contact of claim 16 wherein said conductor layer is a metal layer.

18. A semiconductor device formed of Group II–VI compound semiconductor materials comprising:
    an optical emission heterostructure formed of Group II–VI compound semiconductor materials, and including a layer of p-type zinc selenide (ZnSe) or an alloy thereof;
    a zinc mercury selenide ($Zn_xHg_{1-x}Se$) layer on said layer of p-type ZnSe or an alloy thereof, where $0<x<1$;
    a mercury selenide (HgSe) layer on said $Zn_xHg_{1-x}Se$ layer; and
    a conductor layer on said HgSe layer, said $Zn_xHg_{1-x}Se$ layer and said HgSe layer forming an ohmic contact between said p-type ZnSe or an alloy thereof, and said conductor layer.

19. The semiconductor device of claim 18 wherein x is constant in said $Zn_xHg_{1-x}Se$ layer to provide a step graded $Zn_xHg_{1-x}Se$ layer.

20. The semiconductor device of claim 18 wherein x decreases across said $Zn_xHg_{1-x}Se$ layer, from said ZnSe layer to said HgSe layer, to provide a graded $Zn_xHg_{1-x}Se$ layer.

21. The semiconductor device of claim 20 wherein x decreases linearly across said $Zn_xHg_{1-x}Se$ layer, from said ZnSe layer to said HgSe layer, to provide a linear graded $Zn_xHg_{1-x}Se$ layer.

22. The semiconductor device of claim 20 wherein x decreases nonlinearly across said $Zn_xHg_{1-x}Se$ layer, from said ZnSe layer to said HgSe layer, to provide a nonlinear graded $Zn_xHg_{1-x}Se$ layer.

23. The semiconductor device of claim 22 wherein x decreases parabolically across said $Zn_xHg_{1-x}Se$ layer, from said ZnSe layer to said Hgse layer, to provide a parabolic graded $Zn_xHg_{1-x}Se$ layer.

24. The semiconductor device of claim 23 wherein a first half of said $Zn_xHg_{1-x}Se$ layer adjacent said ZnSe layer is p-type, and a second half of said $Zn_xHg_{1-x}Se$ layer adjacent said HgSe layer is of neutral conductivity.

25. The semiconductor device of claim 18 wherein at least a portion of said $Zn_xHg_{1-x}Se$ layer is p-type.

26. The semiconductor device of claim 25 wherein said $Zn_xHg_{1-x}Se$ layer is p-type adjacent said ZnSe layer, and is of neutral conductivity adjacent said HgSe layer.

27. The semiconductor device of claim 18 wherein said zinc mercury selenide layer is p-type modulation doped.

28. A semiconductor device formed of Group II–VI compound semiconductor materials, comprising:
   an optical emission heterostructure formed of Group II–VI compound semiconductor materials and including a layer of p-type Group II–VI compound semiconductor material;
   a ternary compound Group II–VI semiconductor material on said layer of p-type Group II–VI compound semiconductor material;
   a Group II–VI semimetal on said ternary compound Group II–VI semiconductor material; and
   a conductor on said Group II–VI semimetal, said ternary compound Group II–VI semiconductor material and said Group II–VI semimetal forming an ohmic contact between said layer of p-type Group II–VI compound semiconductor material and said conductor.

29. The semiconductor device of claim 28 wherein said ternary compound Group II–VI semiconductor material is zinc mercury selenide.

30. The semiconductor device of claim 28 wherein said Group II–VI semimetal is mercury selenide.

31. The semiconductor device of claim 28 wherein said conductor is a metal.

32. The semiconductor device of claim 28 wherein said ternary compound Group II–VI semiconductor material and said Group II–VI semimetal form a monocrystalline heterostructure.

33. A semiconductor device formed of Group II–VI compound semiconductor materials, comprising:
   an optical emission heterostructure formed of Group II–VI compound semiconductor materials, and including a layer of p-type zinc selenide (ZnSe) or an alloy thereof;
   a mercury selenide (HgSe) heterostructure on said p-type ZnSe layer; and
   a conductor layer on said HgSe heterostructure, said conductor layer being spaced from said p-type $Z_nS_e$ layer by said $H_gS_e$ heterostructure, said HgSe heterostructure forming an ohmic contact between said layer of p-type ZnSe and said conductor layer.

34. The semiconductor device of claim 33 wherein said conductor layer is a metal layer.

* * * * *